US011508655B2

(12) United States Patent
Chang et al.

(10) Patent No.: US 11,508,655 B2
(45) Date of Patent: Nov. 22, 2022

(54) SEMICONDUCTOR PACKAGE STRUCTURE AND METHOD FOR MANUFACTURING THE SAME

(71) Applicant: Advanced Semiconductor Engineering, Inc., Kaohsiung (TW)

(72) Inventors: Yung-Shun Chang, Kaohsiung (TW); Meng-Wei Hsieh, Kaohsiung (TW); Teck-Chong Lee, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 14 days.

(21) Appl. No.: 16/737,817

(22) Filed: Jan. 8, 2020

(65) Prior Publication Data
US 2021/0210423 A1 Jul. 8, 2021

(51) Int. Cl.
*H01L 23/522* (2006.01)
*H01L 21/56* (2006.01)
*H01L 21/768* (2006.01)
*H01L 23/31* (2006.01)
*H01L 23/00* (2006.01)
*H01L 23/528* (2006.01)

(52) U.S. Cl.
CPC .......... *H01L 23/5226* (2013.01); *H01L 21/56* (2013.01); *H01L 21/76871* (2013.01); *H01L 23/3107* (2013.01); *H01L 23/5283* (2013.01); *H01L 24/05* (2013.01); *H01L 2224/02371* (2013.01)

(58) Field of Classification Search
CPC ............. H01L 23/5226; H01L 23/3107; H01L 23/4824; H01L 21/56; H01L 21/76871; H01L 2224/02371; H01L 2224/214; H01L 24/05

See application file for complete search history.

(56) References Cited

U.S. PATENT DOCUMENTS

| | | | | |
|---|---|---|---|---|
| 10,283,473 B1* | 5/2019 | Yu | ........................... | H01L 25/03 |
| 10,510,646 B2* | 12/2019 | Lee | ......................... | H01L 24/13 |
| 10,734,323 B2* | 8/2020 | Lin | .......................... | H01L 23/66 |
| 11,031,344 B2* | 6/2021 | Yu | ........................ | H01L 21/4853 |
| 2014/0264930 A1* | 9/2014 | Yu | ............................. | H01L 24/19 |
| | | | | 257/774 |
| 2014/0367160 A1* | 12/2014 | Yu | ...................... | H01L 21/76885 |
| | | | | 174/377 |
| 2017/0287838 A1 | 10/2017 | Pietambaram et al. | | |
| 2019/0103680 A1* | 4/2019 | Liao | ......................... | H01L 23/66 |
| 2020/0075470 A1* | 3/2020 | Kuo | ..................... | H01L 23/49866 |
| 2020/0105666 A1* | 4/2020 | Bae | .......................... | H01L 24/13 |

* cited by examiner

*Primary Examiner* — Dao H Nguyen
(74) *Attorney, Agent, or Firm* — Foley & Lardner LLP

(57) ABSTRACT

A semiconductor package structure includes a semiconductor die and at least one pillar structure. The semiconductor die has an upper surface and includes at least one conductive pad disposed adjacent to the upper surface. The pillar structure is electrically connected to the conductive pad of the semiconductor die, and defines a recess portion recessed from a side surface of the pillar structure. A conductivity of the pillar structure is greater than a conductivity of the conductive pad.

18 Claims, 30 Drawing Sheets

SEMICONDUCTOR PACKAGE STRUCTURE AND METHOD FOR MANUFACTURING THE SAME

BACKGROUND

1. Field of the Disclosure

The present disclosure relates to a semiconductor package structure and a manufacturing method, and to a semiconductor package structure including at least one pillar structure for vertical electrical connection and a method for manufacturing the semiconductor package structure.

2. Description of the Related Art

As for a semiconductor package such as a fan-out chip on substrate (FOCoS) package, a semiconductor die may be covered by an encapsulant. To reduce a whole thickness of the semiconductor package, the encapsulant may be thinned by, for example, grinding. However, when a thickness of the encapsulant that covers the semiconductor die is thinned to a lower value through grinding, the encapsulant may fall off from the semiconductor die, thereby causing the semiconductor die to be exposed.

SUMMARY

In some embodiments, a semiconductor package structure includes a semiconductor die and at least one pillar structure. The semiconductor die has an upper surface and includes at least one conductive pad disposed adjacent to the upper surface. The pillar structure is electrically connected to the conductive pad of the semiconductor die, and defines a recess portion recessed from a side surface of the pillar structure. A conductivity of the pillar structure is greater than a conductivity of the conductive pad.

In some embodiments, a semiconductor package structure includes a semiconductor die, at least one pillar structure and an encapsulant. The semiconductor die has an upper surface. The pillar structure is disposed adjacent to the upper surface of the semiconductor die, and includes a lower pillar portion protruding from the upper surface and an upper pad portion disposed on and connected to the lower pillar portion. The encapsulant covers the semiconductor die and at least a portion of the pillar structure. At least a portion of the upper pad portion of the pillar structure is embedded in the encapsulant.

In some embodiments, a method for manufacturing a semiconductor package structure includes: (a) providing a semiconductor substrate; (b) forming a plurality of pillar structures on the semiconductor substrate, wherein each of the pillar structures includes a lower pillar portion and an upper pad portion on the lower pillar portion, wherein a width of the upper pad portion is greater than a width of the lower pillar portion; (c) forming an encapsulant to cover at least one semiconductor substrate and the pillar structure on the at least one semiconductor substrate; and (d) removing a portion of the encapsulant to expose a top surface of the upper pad portion of the pillar structure.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
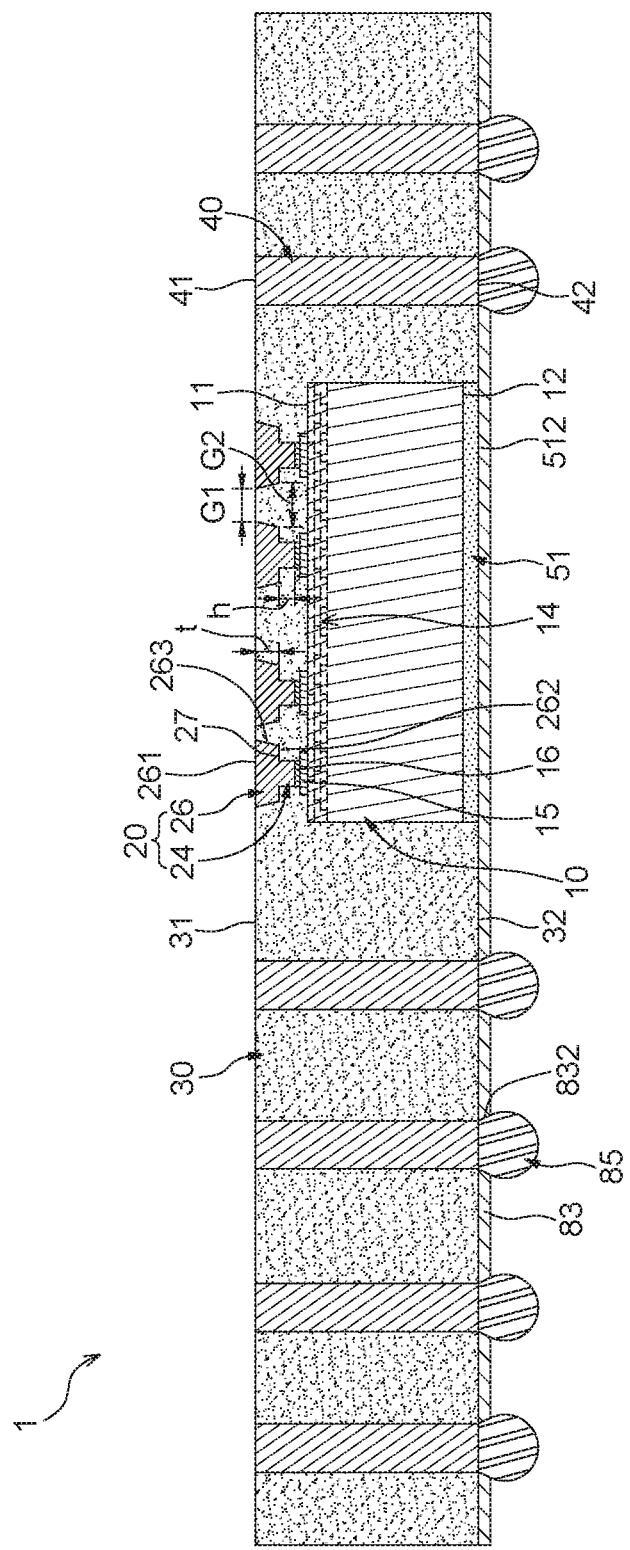
FIG. 1 illustrates a cross-sectional view of a semiconductor package structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 2:
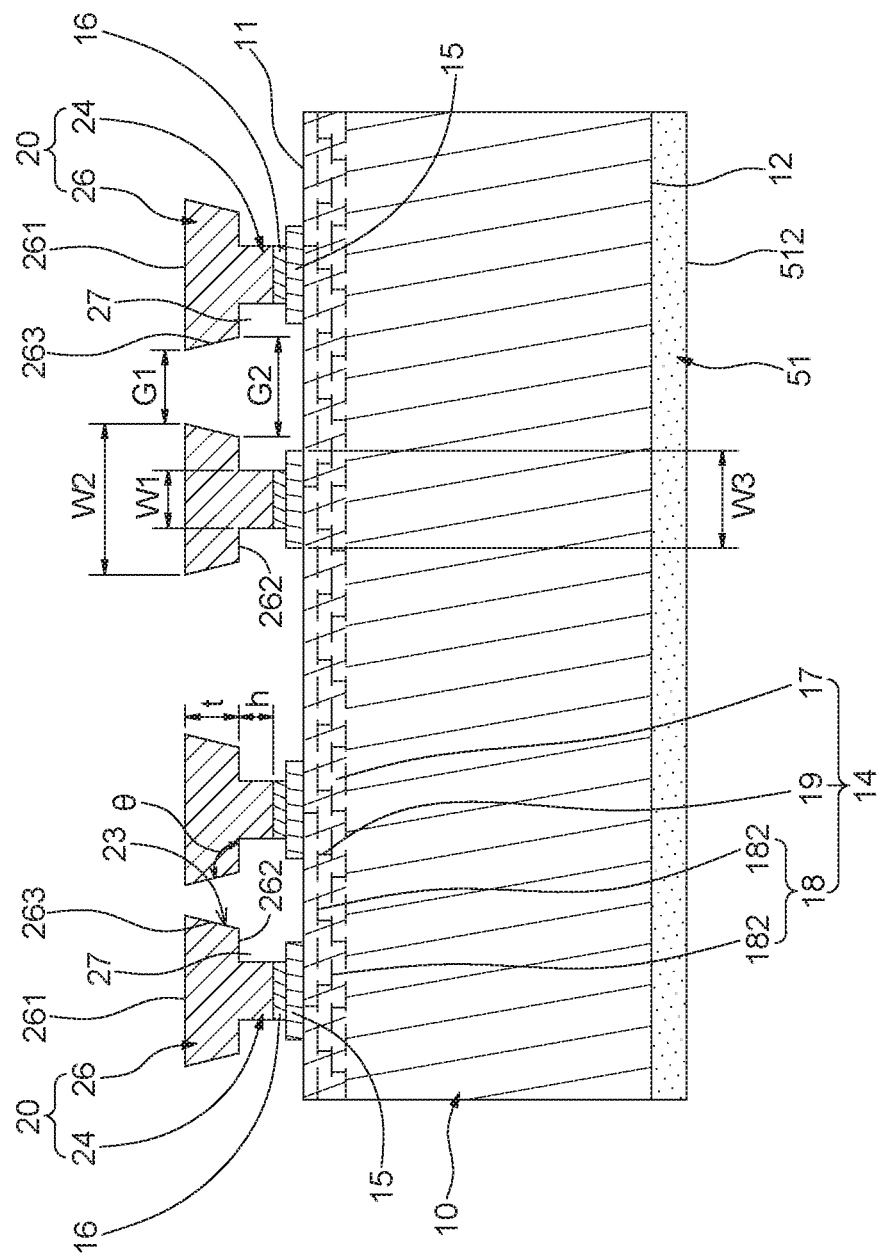
FIG. 2 illustrates an enlarged view of a combination of a semiconductor die and at least one pillar structure of FIG. 1.

FIG. 1 illustrates a cross-sectional view of a semiconductor package structure 1 according to some embodiments of the present disclosure. FIG. 2 illustrates an enlarged view of a combination of a semiconductor die 10 and at least one pillar structure 20 of FIG. 1. The semiconductor package structure 1 includes a semiconductor die 10, at least one pillar structure 20, a plurality of conductive pillars 40, an adhesive layer 51, an encapsulant 30, a protection layer 83 and a plurality of electrical connectors 85. In some embodiments, the semiconductor package structure 1 may be a bridge device for electrically connecting at least two semiconductor devices.

The semiconductor die 10 may be, for example, a bridge die. The semiconductor die 10 has an upper surface 11 (e.g., active surface) and a lower surface 12 (e.g., back side surface) opposite to the upper surface 11. In some embodiments, the semiconductor die 10 may include a redistribution structure 14, at least one conductive pad 15 and a seed layer 16.

The redistribution structure 14 may include a dielectric structure 17, a redistribution layer 18 and a plurality of inner vias 19. A top surface of the dielectric structure 17 may be the upper surface 11 of the semiconductor die 10. In some embodiments, the dielectric structure 17 may be a passivation layer made of silicon nitride or silicon oxide. The redistribution layer 18 may be embedded in the dielectric structure 17 and may include a plurality of circuit layers 182. The inner vias 19 may electrically connect at least one circuit layer 182 or two adjacent circuit layers 182 of the redistribution layer 18.

The conductive pad 15 is disposed adjacent to the upper surface 11 of the semiconductor die 10. A material of the conductive pad 15 may be, for example, aluminum (Al) tin (Sn), lead (Pb) or other low conductivity metals or alloy. In the present embodiment, the material of the conductive pad 15 is aluminum (Al). In some embodiments, the conductive pad 15 may be disposed on the redistribution structure 14 (e.g., the top surface of the dielectric structure 17) and electrically connected to the redistribution structure 14. Further, the conductive pad 15 may be electrically connected to the redistribution layer 18 (e.g., the circuit layers 182) of the redistribution structure 14. The seed layer 16 is disposed on the conductive pad 15 and covers at least a portion of the conductive pad 15. A material of the seed layer 16 may be, for example, copper or copper alloy.

The pillar structure 20 is disposed adjacent to the upper surface 11 of the semiconductor die 10 and electrically connected to the conductive pad 15 of the semiconductor die 10. A material of the pillar structure 20 may be, for example, copper, silver (Ag), gold (Au) or other high conductivity metals or alloy. That is, a conductivity of the pillar structure 20 may be greater than a conductivity of the conductive pad 15 (e.g., Al pad). In the present embodiment, the material of the pillar structure 20 is copper. In some embodiments, the pillar structure 20 may include a lower pillar portion 24 and an upper pad portion 26, and may define a recess portion 27.

The lower pillar portion 24 may be disposed on the seed layer 16 and electrically connected to the conductive pad 15. That is, the lower pillar portion 24 may be disposed on the conductive pad 15 through the seed layer 16. In some embodiments, the lower pillar portion 24 may protrude from the upper surface 11 of the semiconductor die 10. As shown in FIG. 2, a width W1 of the lower pillar portion 24 may be less than a width W3 of the conductive pad 15, so as to prevent the lower pillar portion 24 of the pillar structure 20 from electrically coupling with the redistribution layer 18 (e.g., the circuit layers 182) of the redistribution structure 14.

The upper pad portion 26 is disposed on and connected to the lower pillar portion 24. That is, the lower pillar portion 24 may be disposed between the upper pad portion 26 and the conductive pad 15. In some embodiments, the upper pad portion 26 and the lower pillar portion 24 may be formed concurrently and integrally. That is, the pillar structure 20 may be a monolithic structure.

The upper pad portion 26 has a top surface 261, a bottom surface 262 opposite to the top surface 261 and a side surface 263 extending between the top surface 261 and the bottom surface 262. The side surface 263 of the upper pad portion 26 may be a portion of a side surface 23 of the pillar structure 20. As shown in FIG. 2, the upper pad portion 26 and the lower pillar portion 24 may constitute a T-shaped pillar structure 20. That is, a maximum width W2 of the upper pad portion 26 may be greater than the width W1 of the lower pillar portion 24, and a surface area of the top surface 261 of the upper pad portion 26 may be greater than a cross-sectional area of the lower pillar portion 24. In some embodiments, the surface area of the top surface 261 of the upper pad portion 26 may be about 1.28 times to about 2.77 times the cross-sectional area of the lower pillar portion 24. This is due to when the surface area of the top surface 261 of the upper pad portion 26 is less than 1.28 times the cross-sectional area of the lower pillar portion 24, a bonding strength between the upper pad portion 26 and an encapsulant may become weak, and when the surface area of the top surface 261 of the upper pad portion 26 is greater than 2.77 times the cross-sectional area of the lower pillar portion 24, the electrically coupling may be generated between the upper pad portions 26 and a photoresist layer used for manufacturing the pillar structure 20 may be remained in the recess portion 27 (e.g., below the upper pad portions 26) and is difficult to be removed. Further, a thickness t of the upper pad portion 26 may be greater than or equal to a height h of the lower pillar portion 24. In some embodiments, the thickness t of the upper pad portion 26 may be less than the height h of the lower pillar portion 24.

In some embodiments, the upper pad portion 26 may taper downwardly along a direction from the top surface 261 towards the bottom surface 262. That is, the side surface 263 of the upper pad portion 26 may be an oblique surface, and an included angle θ between the bottom surface 262 and the side surface 263 may be an obtuse angle. As shown in FIG. 2, the at least one pillar structure 20 may include a plurality of pillar structures 20, and a first gap G1 between two top surfaces 261 of two adjacent upper pad portions 26 of two adjacent pillar structures 20 may be less than a second gap G2 between two bottom surfaces 262 of the two adjacent upper pad portions 26.

The recess portion 27 may be recessed from a side surface 23 of the pillar structure 20 and below the upper pad portion 26. In some embodiments, the recess portion 27 may be defined by the upper pad portion 26, the lower pillar portion 24, the seed layer 16 and the conductive pad 15. In some embodiments, the bottom surface 262 of the upper pad portion 26 may be substantially perpendicular to a side surface of the lower pillar portion 24, and the side surface of the lower pillar portion 24 may be substantially perpendicular to a top surface of the conductive pad 15.

Referring to FIG. 1, the conductive pillars 40 are disposed adjacent to the semiconductor die 10. A material of each of the conductive pillars 40 may be, for example, copper, silver (Ag), gold (Au) or other high conductivity metals or alloy. That is, a conductivity of each of the conductive pillars 40 may be greater than the conductivity of the conductive pad 15 (e.g., Al pad). In the present embodiment, the material of the pillar structure 20 is copper. Each of the conductive pillars 40 has a top surface 41 and a bottom surface 42 opposite to the top surface 41. The top surface 41 of each of the conductive pillars 40 may be substantially coplanar with the top surface 261 of the upper pad portion 26.

The adhesive layer 51 is attached to the lower surface 12 of the semiconductor die 10. In some embodiments, a bottom surface 512 of the adhesive layer 51 may be substantially coplanar with the bottom surface 42 of each of the conductive pillars 40. Thus, a length of the conductive pillar 40 may be substantially equal to a sum of a thickness of the pillar structure 20, a thickness of the semiconductor die 10 and a thickness of the adhesive layer 51 (e.g., a distance from the top surface 261 of the upper pad portion 26 to the bottom surface 512 of the adhesive layer 51).

The encapsulant 30 covers the semiconductor die 10, at least a portion of the pillar structure 20, the conductive pillars 40 and the adhesive layer 51. A material of the encapsulant 30 may be a molding compound with or without fillers. The encapsulant 30 has an upper surface 31 and a lower surface 32 opposite to the upper surface 31. The upper surface 31 of the encapsulant 30 may be substantially coplanar with the top surface 261 of the upper pad portion 26 of the pillar structure 20 and the top surface 41 of each of the conductive pillars 40. The lower surface 32 of the encapsulant 30 may be substantially coplanar with the bottom surface 42 of each of the conductive pillars 40 and the bottom surface 512 of the adhesive layer 51. Further, each of the conductive pillars 40 may extend through the encapsulant 30. The top surface 41 of each of the conductive pillars 40 may be exposed from the upper surface 31 of the encapsulant 30, and the bottom surface 42 of each of the conductive pillars 40 may be exposed from the lower surface 32 of the encapsulant 30.

In some embodiments, at least a portion (e.g., the bottom surface 262 and the side surface 263) of the upper pad portion 26 of the pillar structure 20 may be embedded in the encapsulant 30. As shown in FIG. 1, the whole upper pad portion 26 of the pillar structure 20 may be embedded in the encapsulant 30, and the encapsulant 30 may cover the bottom surface 262 and the side surface 263 of the upper pad portion 26, the recess portion 27 and the lower pillar portion 24. That is, a bonding area between the encapsulant 30 and the pillar structure 20 may correspondingly increase through the upper pad portion 26, the recess portion 27 and the lower pillar portion 24. In addition, a bonding strength between the encapsulant 30 and the pillar structure 20 may be greatly improved due to a portion of the encapsulant 30 disposed in the recess portion 27, thereby preventing the encapsulant 30 (including, for example, the fillers) from falling off from the semiconductor die 10 during a grinding process. Therefore, a thickness of a portion of the encapsulant 30 on the semiconductor die 10 may be thinned to a desired thickness such as equal to or less than 15 µm.

The protection layer 83 is disposed on the lower surface 32 of the encapsulant 30 and may define a plurality of openings 832 extending through the protection layer 83. Each of the openings 832 may expose at least a portion of the bottom surface 42 of each of the conductive pillars 40. In some embodiments, the protection layer 83 may cover the adhesive layer 51. The protection layer 83 may include one or more dielectric layers made of a cured photoimageable dielectric (PID) material such as epoxy or polyimide (PI) including photoinitiators.

The electrical connectors 85 (e.g., solder balls or solder bumps) are disposed in the openings 832 of the protection layer 83 and on the exposed portions of the bottom surfaces 42 of the conductive pillars 40 for external connection.

Figure 3:
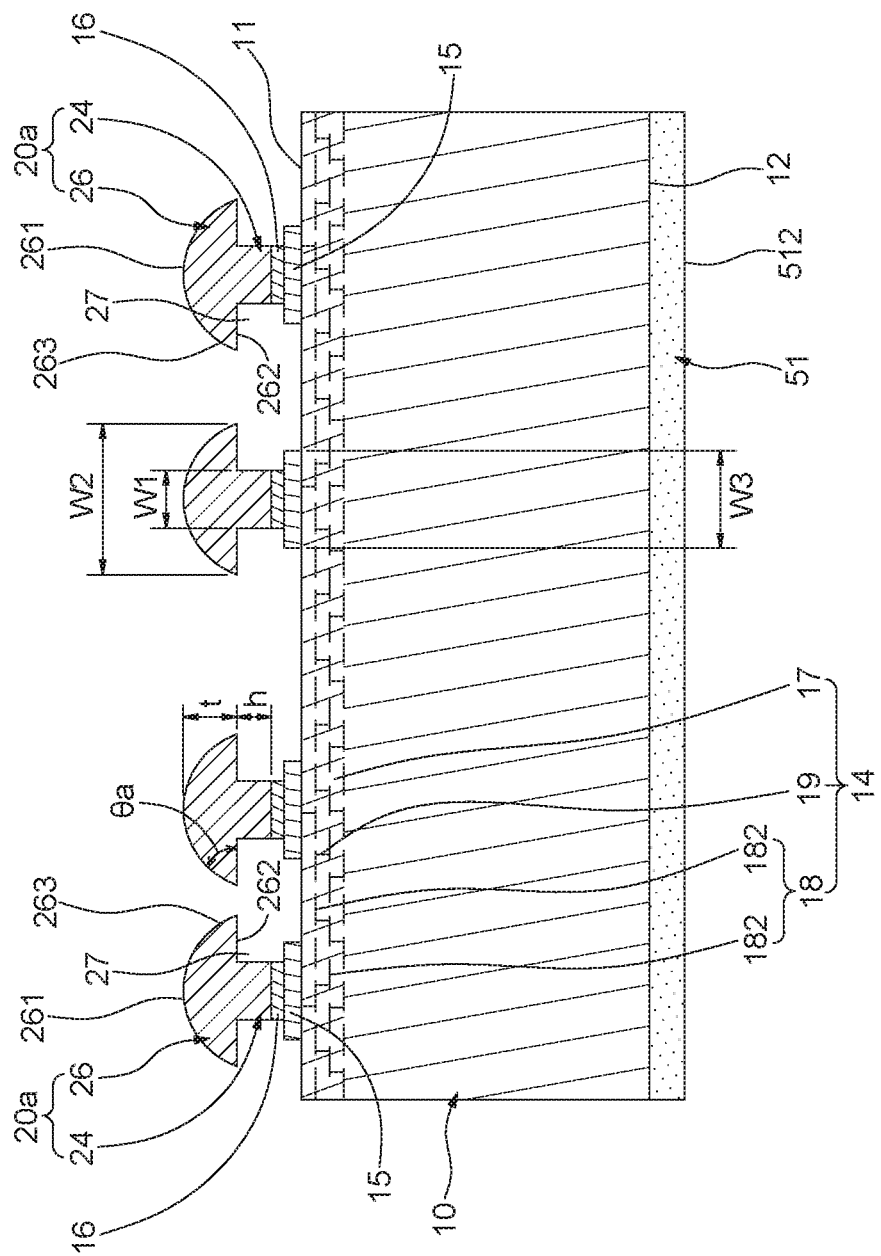
FIG. 3 illustrates a cross-sectional view of a combination of a semiconductor die and pillar structures according to some embodiments of the present disclosure.

FIG. 3 illustrates a cross-sectional view of a combination of a semiconductor die 10 and pillar structures 20a according to some embodiments of the present disclosure. The combination structure of FIG. 3 is similar to the combination structure of FIG. 2, except that the upper pad portion 26 and the lower pillar portion 24 of FIG. 3 may constitute a mushroom-shaped pillar structure 20a. That is, the top surface 261 and the side surface 263 of the upper pad portion 26 may be curved surfaces, and the upper pad portion 26 may taper upwardly along a direction from the bottom surface 262 towards the top surface 261. In some embodiments, the top surface 261 and the side surface 263 of the upper pad portion 26 may constitute a continuous curved surface. Further, an included angle θa between the bottom surface 262 and the side surface 263 may be an acute angle.

Figure 4:
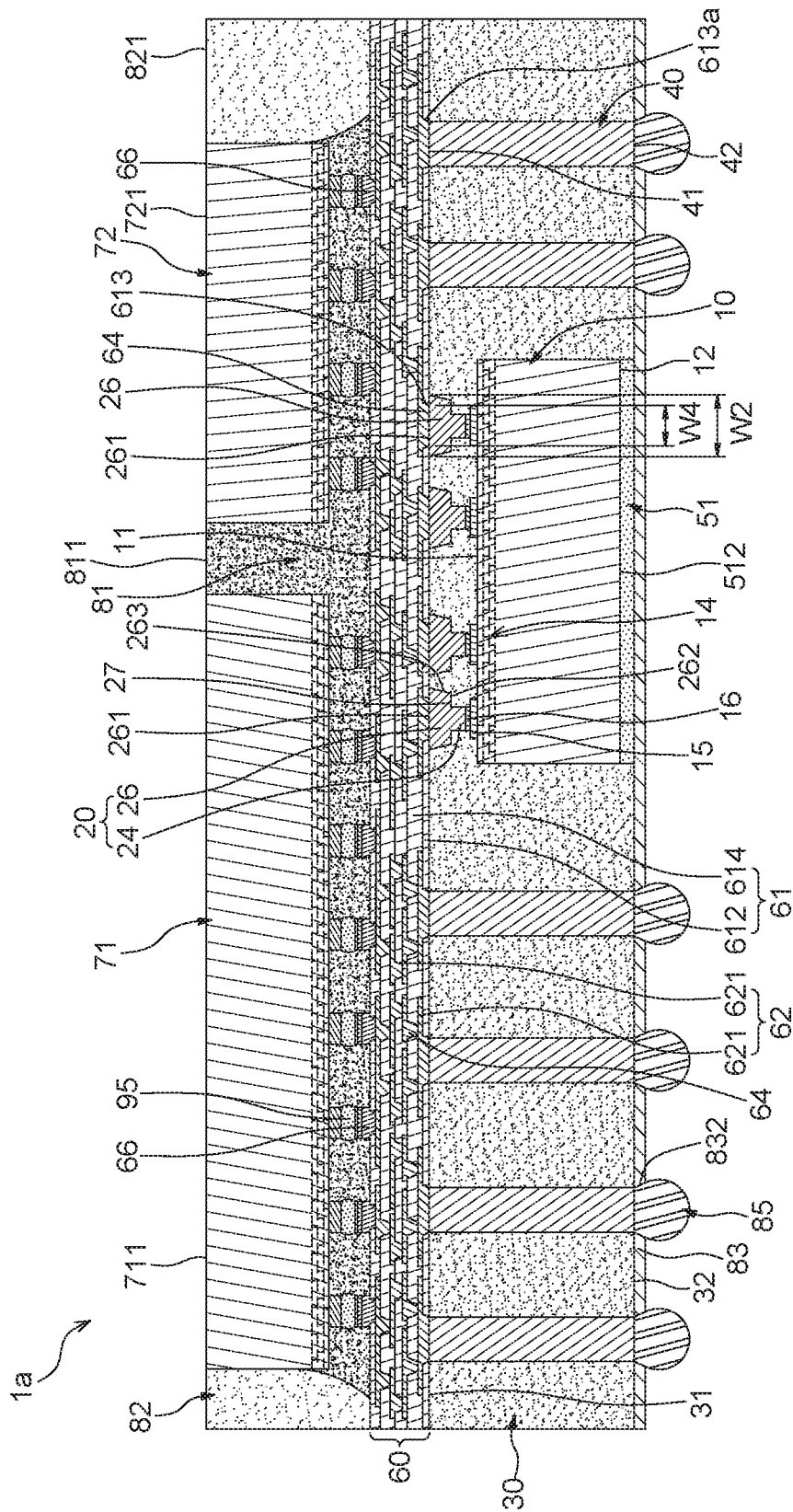
FIG. 4 illustrates a cross-sectional view of a semiconductor package structure according to some embodiments of the present disclosure.

FIG. 4 illustrates a cross-sectional view of a semiconductor package structure 1a according to some embodiments of the present disclosure. The semiconductor package structure 1a is similar to the semiconductor package structure 1 shown in FIG. 1, except that the semiconductor package structure 1a further includes a redistribution structure 60, a first semiconductor device 71, a second semiconductor device 72, an underfill 81 and an encapsulant 82. The redistribution structure 60 is disposed on the upper surface 31 of the encapsulant 30 and electrically connected to the upper pad portion 26 of the pillar structure 20 and the conductive pillars 40. In some embodiments, the upper pad portion 26 of the pillar structure 20 and the conductive pillars 40 may contact the redistribution structure 60 directly.

The redistribution structure 60 may include a dielectric structure 61, a redistribution layer 62, a plurality of inner vias 64 and a plurality of bonding pads 66. The dielectric structure 61 may include a first dielectric layer 612 and at least one second dielectric layer 614. The first dielectric layer 612 may be disposed on the upper surface 31 of the encapsulant 30, and may define at least one first opening 613 extending through the first dielectric layer 612 to expose a portion (e.g., a portion of the top surface 261) of the upper pad portion 26 of the pillar structure 20 and a plurality of second openings 613a extending through the first dielectric layer 612 to expose a portion (e.g., at least a portion of the top surface 41) of each of the conductive pillars 40. In some embodiments, a width W4 of the first opening 613 may be less than the maximum width W2 of the upper pad portion 26. Thus, the upper pad portion 26 may provide more alignment tolerance to ensure the first opening 613 of the first dielectric layer 612 being aligned with the upper pad portion 26 of the pillar structure 20.

The second dielectric layer 614 may be disposed on a top surface of the first dielectric layer 612. The first dielectric layer 612 and the second dielectric layer 614 may be made of a cured photoimageable dielectric (PID) material such as epoxy or polyimide (PI) including photoinitiators. The redistribution layer 62 may be embedded in the dielectric structure 61 and may include a plurality of circuit layers 621. The inner vias 64 may electrically connect at least one circuit layer 621 or two adjacent circuit layers 621 of the redistribution layer 62. In some embodiments, some of the inner vias 64 may be formed on or contact the exposed portion (e.g., the exposed portion of the top surface 261) of the upper pad portion 26 of the pillar structure 20 and the exposed portion (e.g., the exposed portion of the top surface 41) of the conductive pillars 40 directly. Further, the inner vias 64 may taper toward the encapsulant 30. As shown in FIG. 4, the topmost second dielectric layer 614 may cover the topmost circuit layer 621, and may define a plurality of openings to expose portions of the topmost circuit layer 621.

The bonding pads 66 may be disposed in the openings of the topmost second dielectric layer 614 and on the expose portions of the topmost circuit layer 621.

The first semiconductor device 71 and the second semiconductor device 72 are disposed adjacent to the redistribution structure 60 and electrically connected to the redistribution structure 60. The first semiconductor device 71 may be, for example, an application specific integrated circuit (ASIC) device. The second semiconductor device 72 may be, for example, a high bandwidth memory (HBM) device. The second semiconductor device 72 may be disposed side by side with the first semiconductor device 71. In some embodiments, the first semiconductor device 71 and the second semiconductor device 72 may be bonded to the bonding pads 66 of the redistribution structure 60 through a bonding material 95. Further, a top surface 711 of the first semiconductor device 71 may be substantially coplanar with a top surface 721 of the second semiconductor device 72.

The underfill 81 is disposed between the first semiconductor device 71 and the redistribution structure 60 and between the second semiconductor device 72 and the redistribution structure 60 to cover the bonding pads 66 of the redistribution structure 60 and the bonding material 95. In some embodiments, a portion of the underfill 81 may extend between the first semiconductor device 71 and the second semiconductor device 72. Further, a top surface 811 of the extending portion of the underfill 81 may be substantially coplanar with the top surface 711 of the first semiconductor device 71 and the top surface 721 of the second semiconductor device 72.

The encapsulant 82 covers the redistribution structure 60, a portion of the first semiconductor device 71, a portion of the second semiconductor device 72 and a portion of the underfill 81. A material of the encapsulant 82 may be a molding compound with or without fillers. In some embodiments, an upper surface 821 of the encapsulant 82 may be substantially coplanar with the top surface 711 of the first semiconductor device 71, the top surface 721 of the second semiconductor device 72 and the top surface 811 of the extending portion of the underfill 81.

FIG. 5 through FIG. 23 illustrate a method for manufacturing a semiconductor package structure according to some embodiments of the present disclosure. In some embodiments, the method is for manufacturing a semiconductor package structure such as the semiconductor package structure 1 shown in FIG. 1.

Figure 5:
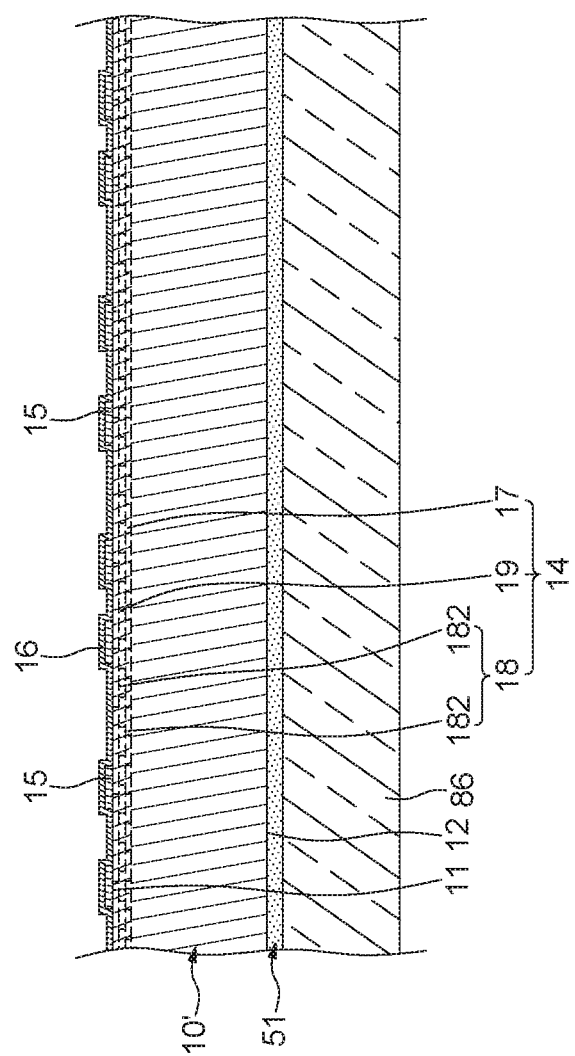
FIG. 5 illustrates one or more stages of an example of a method for manufacturing a semiconductor package structure according to some embodiments of the present disclosure.

Referring to FIG. 5, a semiconductor substrate 10' is provided. The semiconductor substrate 10' may be a semiconductor wafer. The semiconductor substrate 10' is attached to a carrier 86 through an adhesive layer 51. The semiconductor substrate 10' has an upper surface 11 and a lower surface 12 opposite to the upper surface 11. In some embodiments, the semiconductor substrate 10' may include a redistribution structure 14, a plurality of conductive pads 15 and a seed layer 16. The redistribution structure 14 may include a dielectric structure 17, a redistribution layer 18 and a plurality of inner vias 19. A top surface of the dielectric structure 17 may be the upper surface 11 of the semiconductor substrate 10'. In some embodiments, the dielectric structure 17 may be a passivation layer made of silicon nitride or silicon oxide. The redistribution layer 18 may be embedded in the dielectric structure 17 and may include a plurality of circuit layers 182. The inner vias 19 may electrically connect at least one circuit layer 182 or two adjacent circuit layers 182 of the redistribution layer 18. The conductive pads 15 are formed on the upper surface 11 (e.g., the top surface of the dielectric structure 17) of the semiconductor substrate 10'. A material of the conductive pads 15 may be, for example, aluminum (Al) tin (Sn), lead (Pb) or other low conductivity metals or alloy. In the present embodiment, the material of the conductive pad 15 is aluminum (Al). In some embodiments, the conductive pads 15 may be electrically connected to the redistribution structure 14 (e.g., the circuit layers 182 of the redistribution layer 18). The seed layer 16 is formed on the upper surface 11 (e.g., the top surface of the dielectric structure 17) of the semiconductor substrate 10' and covers the conductive pads 15 by, for example, physical vapor deposition (PVD). A material of the seed layer 16 may be, for example, copper or copper alloy.

Figure 6:
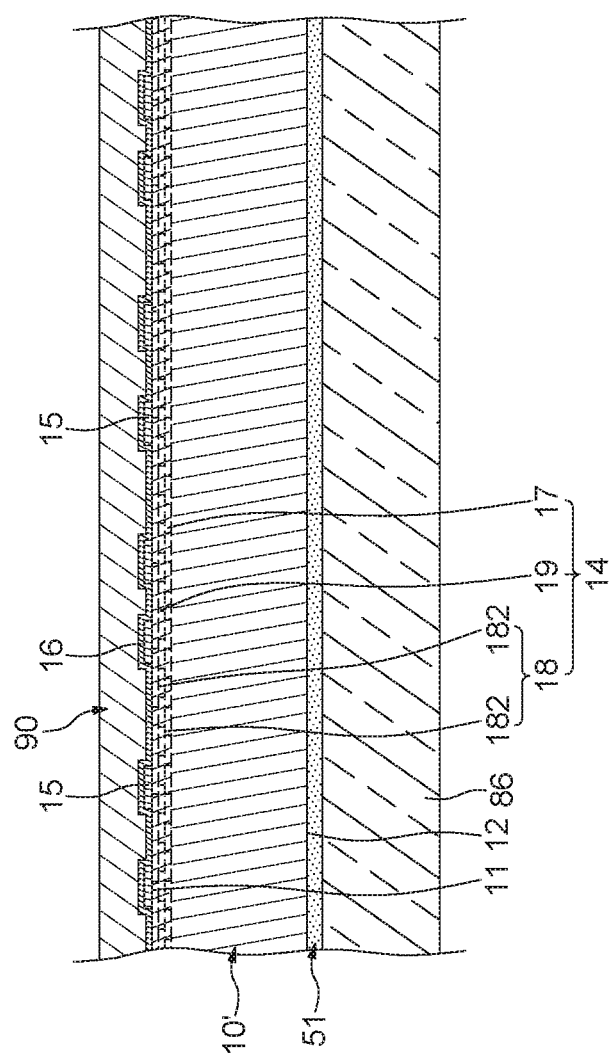
FIG. 6 illustrates one or more stages of an example of a method for manufacturing a semiconductor package structure according to some embodiments of the present disclosure.

Referring to FIG. 6 through FIG. 18, a plurality of pillar structures 20 are formed on portions of the seed layer 16 of the semiconductor substrate 10'. Referring to FIG. 6, a photoresist layer 90 is formed on the seed layer 16 of the semiconductor substrate 10' by, for example, coating. In some embodiments, photoresist layer 90 may be a positive photoresist layer.

Figure 7:
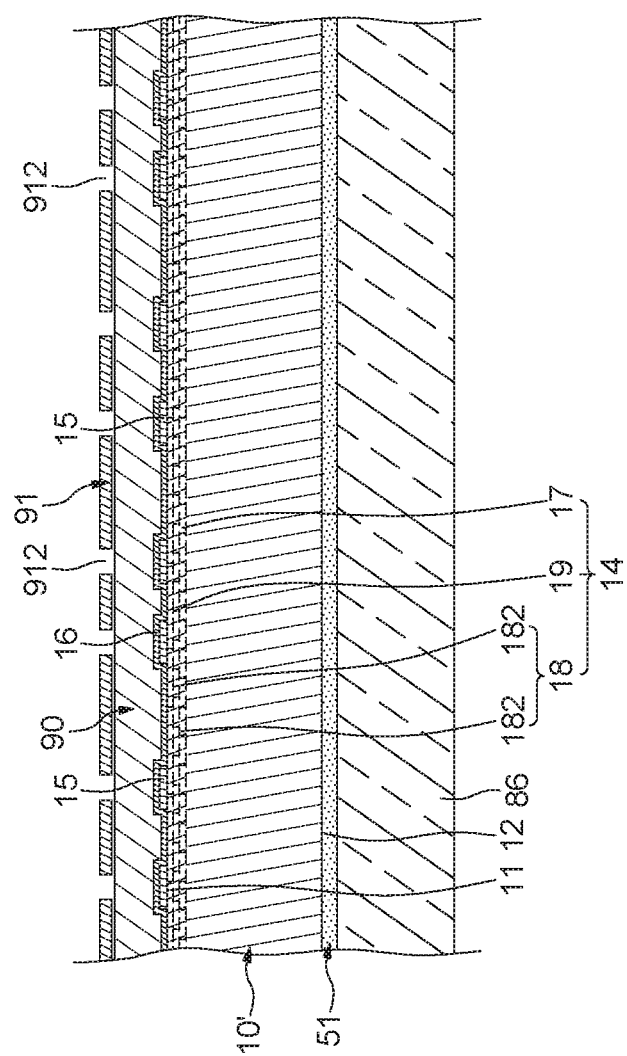
FIG. 7 illustrates one or more stages of an example of a method for manufacturing a semiconductor package structure according to some embodiments of the present disclosure.

Referring to FIG. 7, a first photomask 91 is disposed adjacent to the photoresist layer 90. The first photomask 91 may define a plurality of first openings 912 extending through the first photomask 91.

Figure 8:
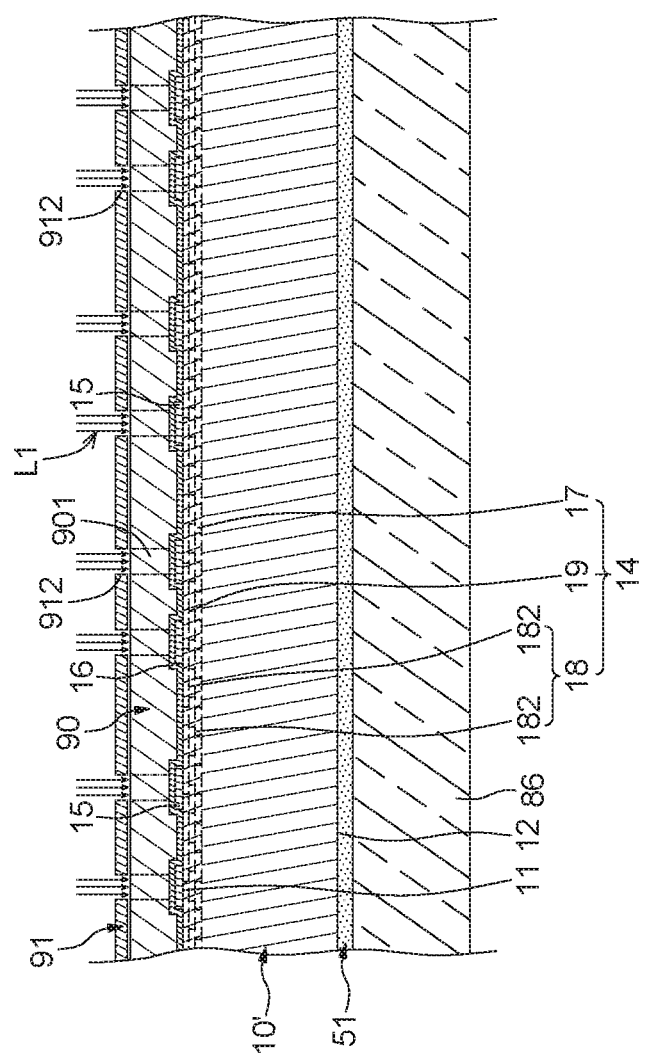
FIG. 8 illustrates one or more stages of an example of a method for manufacturing a semiconductor package structure according to some embodiments of the present disclosure.

Referring to FIG. 8, a plurality of first regions 901 of the photoresist layer 90 are irradiated with a first light L1 through the first openings 912 of the first photomask 91.

Figure 9:
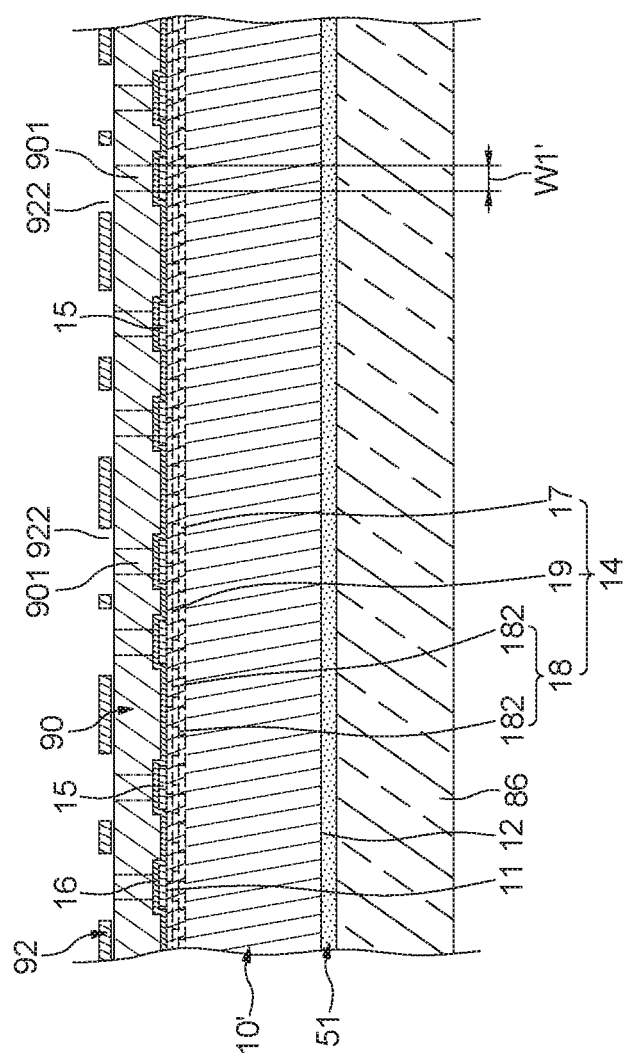
FIG. 9 illustrates one or more stages of an example of a method for manufacturing a semiconductor package structure according to some embodiments of the present disclosure.

Referring to FIG. 9, the first photomask 91 is removed, and a second photomask 92 is disposed adjacent to the photoresist layer 91. The second photomask 92 may define a plurality of second openings 922 extending through the second photomask 92. The second openings 922 may correspond to the first regions 901 of the photoresist layer 90, respectively. In addition, a width of each of the second openings 922 may be greater than a width W1' of each of the first regions 901.

Figure 10:
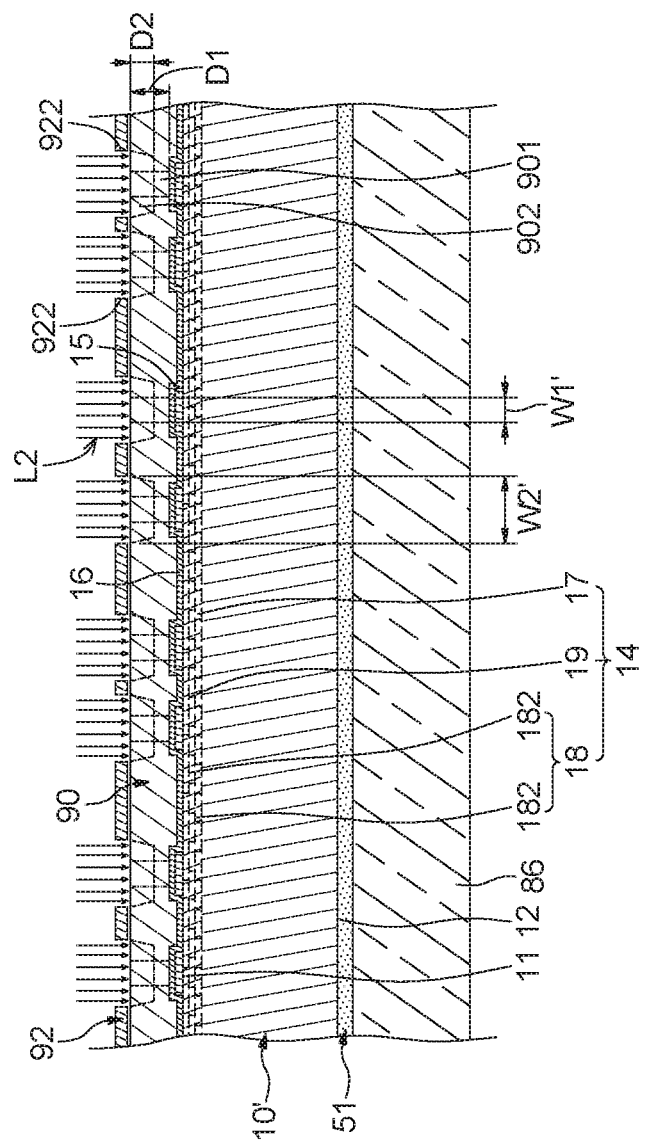
FIG. 10 illustrates one or more stages of an example of a method for manufacturing a semiconductor package structure according to some embodiments of the present disclosure.

Referring to FIG. 10, a plurality of second regions 902 of the photoresist layer 90 are irradiated with a second light L2 through the second openings 922 of the second photomask 92. A width W2' of each of the second regions 902 may be greater than the width W1' of each of the first regions 901, and a portion of each of the second regions 902 may overlap with a portion of each of the first regions 901. In some embodiments, a light intensity of the second light L2 may be lower than a light intensity of the first light L1, to ensure a depth D2 of each of the second regions 902 may be less than a depth D1 of each of the first regions 901.

Figure 11:
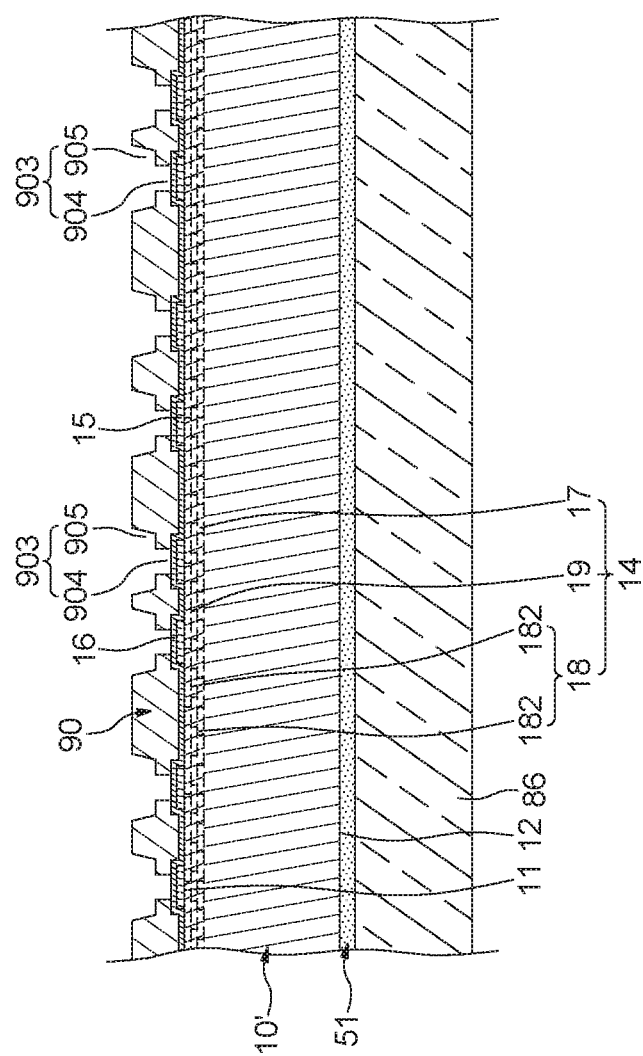
FIG. 11 illustrates one or more stages of an example of a method for manufacturing a semiconductor package structure according to some embodiments of the present disclosure.

Referring to FIG. 11, the second photomask 92 is removed, and then the first regions 901 and the second regions 902 of the photoresist layer 90 are removed to form a plurality of cavities 903. The cavities 903 may extend through the photoresist layer 90. Each of the cavities 903 may include a lower cavity portion 904 and an upper cavity portion 905 in communication with the lower cavity portion 904. Further, the lower cavity portions 904 of the cavities 903 may expose portions of the seed layer 16.

Figure 12:
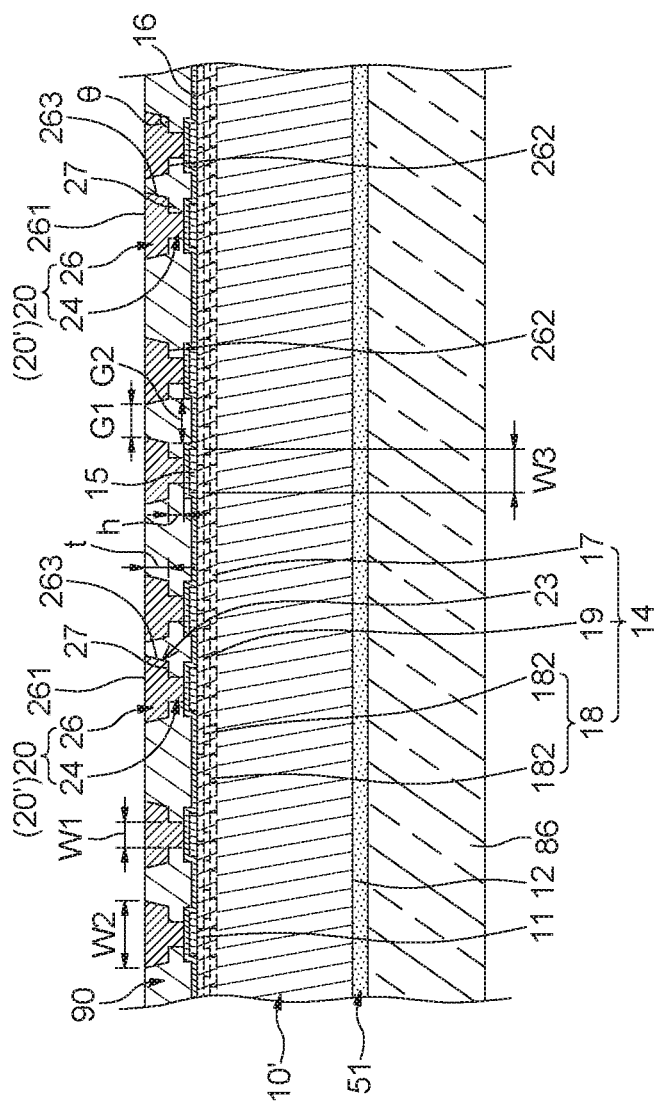
FIG. 12 illustrates one or more stages of an example of a method for manufacturing a semiconductor package structure according to some embodiments of the present disclosure.

Referring to FIG. 12, a conductive material 20' is formed in the cavities 903 of the photoresist layer 90 and on the exposed portions of the seed layer 16 to form the pillar structures 20 by, for example, plating. The conductive material 20' may be, for example, copper. A top surface of the conductive material 20' may be substantially coplanar with a top surface of the photoresist layer 90. Each of the pillar structures 20 may include a lower pillar portion 24, an upper pad portion 26 and a recess portion 27. The lower pillar portion 24 is formed in the lower cavity portion 904 and on the exposed portion of the seed layer 16. The upper pad portion 26 is formed in the upper cavity portion 905 and on the lower pillar portion 24. The recess portion 27 is recessed from a side surface 23 of the pillar structure 20 and below the upper pad portion 26.

The lower pillar portion 24 may be electrically connected to the conductive pad 15 through the seed layer 16. Further, the lower pillar portion 24 may be disposed between the upper pad portion 26 and the conductive pad 15. In some embodiments, a width W1 of the lower pillar portion 24 may be less than a width W3 of the conductive pad 15, so as to prevent the lower pillar portion 24 of the pillar structure 20 from electrically coupling with the redistribution layer 18 (e.g., the circuit layers 182) of the redistribution structure 14.

The upper pad portion 26 and the lower pillar portion 24 are formed concurrently and integrally. Thus, the pillar structure 20 may be a monolithic structure. The upper pad portion 26 has a top surface 261, a bottom surface 262 opposite to the top surface 261 and a side surface 263 extending between the top surface 261 and the bottom surface 262. The side surface 263 of the upper pad portion 26 may be a portion of a side surface 23 of the pillar structure 20. As shown in FIG. 12, the upper pad portion 26 and the lower pillar portion 24 may constitute a T-shaped pillar structure 20. That is, a maximum width W2 of the upper pad portion 26 may be greater than the width W1 of the lower pillar portion 24, and a surface area of the top surface 261 of the upper pad portion 26 may be greater than a cross-sectional area of the lower pillar portion 24. In some embodiments, the surface area of the top surface 261 of the upper pad portion 26 may be about 1.28 times to about 2.77 times the cross-sectional area of the lower pillar portion 24. Further, a thickness t of the upper pad portion 26 may be greater than or equal to a height h of the lower pillar portion 24. In some embodiments, the thickness t of the upper pad portion 26 may be less than the height h of the lower pillar portion 24.

In some embodiments, the upper pad portion 26 may taper downwardly along a direction from the top surface 261 towards the bottom surface 262. That is, the side surface 263 of the upper pad portion 26 may be an oblique surface, and an included angle θ between the bottom surface 262 and the side surface 263 may be an obtuse angle. In addition, a first gap G1 between two top surfaces 261 of two adjacent upper pad portions 26 of two adjacent pillar structures 20 may be less than a second gap G2 between two bottom surfaces 262 of the two adjacent upper pad portions 26.

Figure 13:
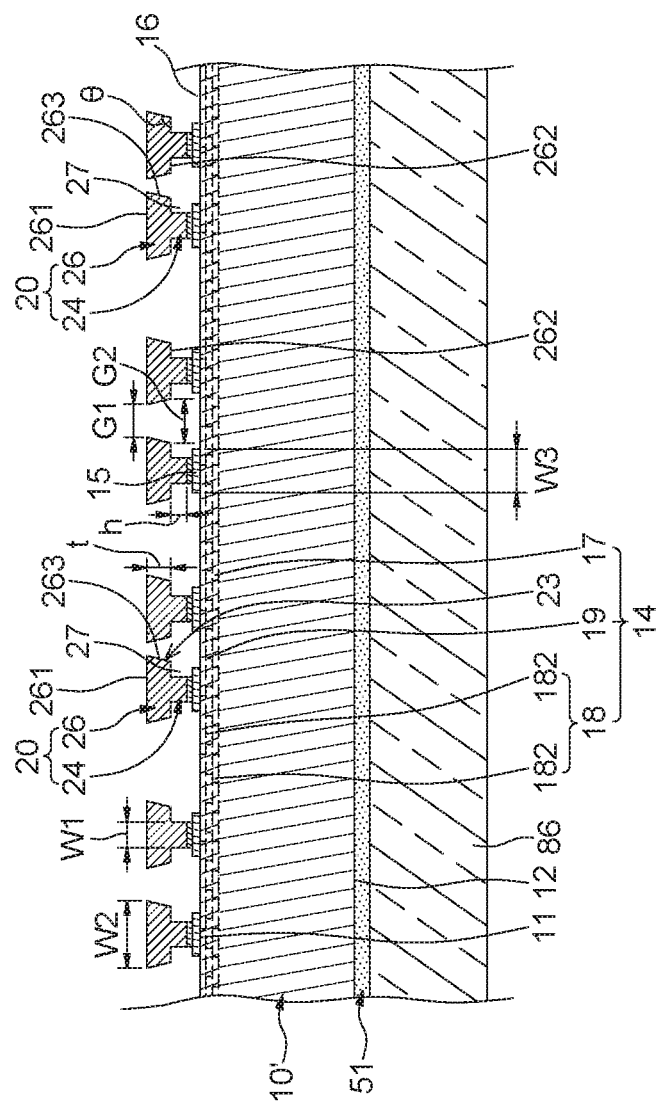
FIG. 13 illustrates one or more stages of an example of a method for manufacturing a semiconductor package structure according to some embodiments of the present disclosure.

Referring to FIG. 13, the photoresist layer 90 is removed to expose the pillar structures 20 (including, for example, the upper pad portions 26, the recess portions 27 and the lower pillar portion 24). Then, portions of the seed layer 16 that are not covered by the lower pillar portions 24 of the pillar structures 20 are removed to expose a portion of each of the conductive pads 15.

Figure 14:
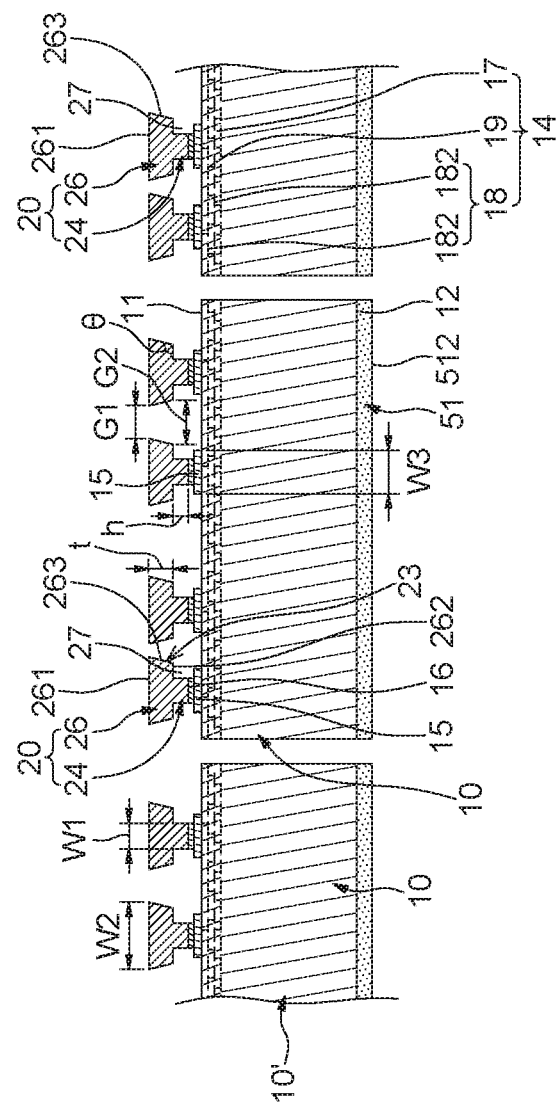
FIG. 14 illustrates one or more stages of an example of a method for manufacturing a semiconductor package structure according to some embodiments of the present disclosure.

Referring to FIG. 14, the semiconductor substrate 10' is singulated to form a plurality of semiconductor dice 10. In some embodiments, at least one pillar structure 20 is located on each of the semiconductor dice 10.

Figure 15:
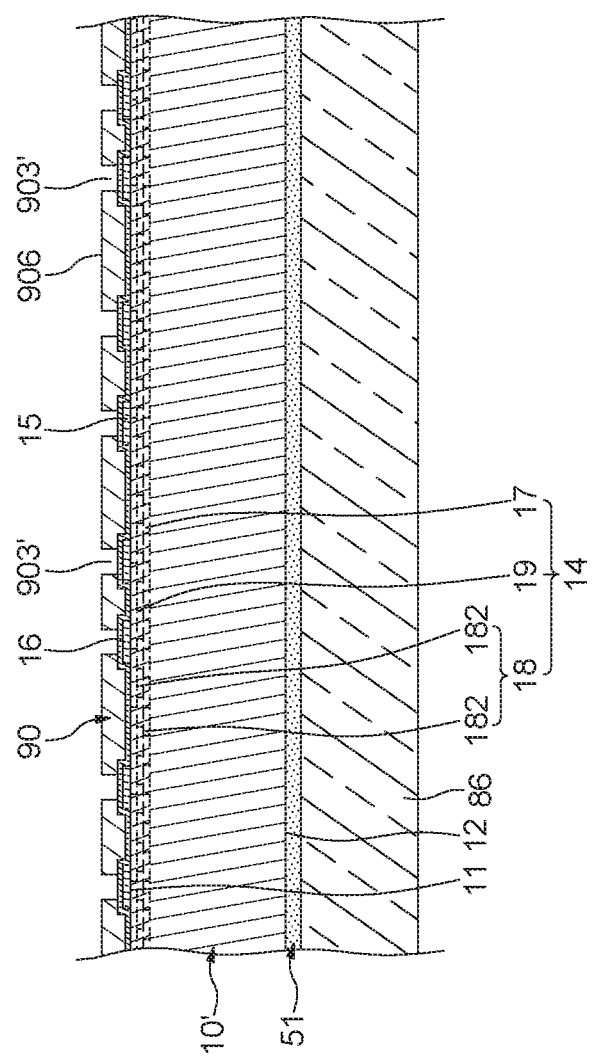
FIG. 15 illustrates one or more stages of an example of a method for manufacturing a semiconductor package structure according to some embodiments of the present disclosure.

In some embodiments, as shown in FIG. 15 through FIG. 18, a plurality of mushroom-shaped pillar structures 20a may be formed on the semiconductor substrate 10'. The initial several stages of the illustrated process are the same as, or similar to, the stages illustrated in FIG. 5 through FIG. 8. FIG. 15 depicts a stage subsequent to that depicted in FIG. 8.

Referring to FIG. 15, the first photomask 91 is removed, and then the first regions 901 of the photoresist layer 90 are removed to form a plurality of cavities 903'. The cavities 903' may extend through the photoresist layer 90 to expose portions of the seed layer 16.

Figure 16:
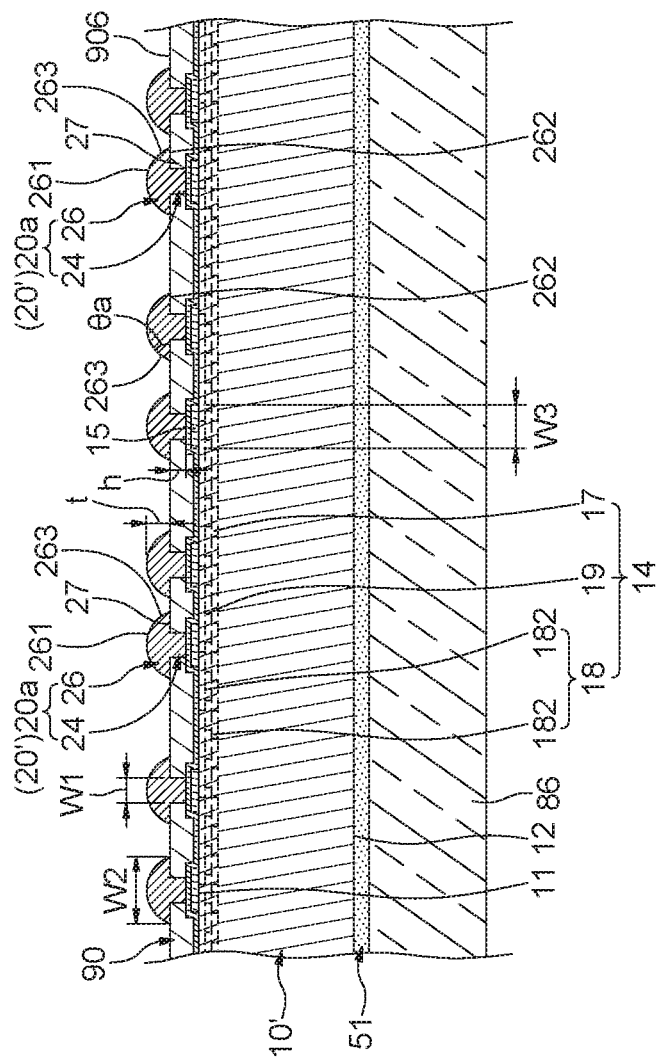
FIG. 16 illustrates one or more stages of an example of a method for manufacturing a semiconductor package structure according to some embodiments of the present disclosure.

Referring to FIG. 16, a conductive material 20' is formed in the cavities 903', on the exposed portions of the seed layer 16 and on portions of a top surface 906 of the photoresist layer 90 to form the mushroom-shaped pillar structures 20a. As shown in FIG. 16, the lower pillar portion 24 is formed in the cavity 903', and the upper pad portion 26 is formed on a portion of the top surface 906 of the photoresist layer 90. The top surface 261 and the side surface 263 of the upper pad portion 26 may be curved surfaces, and the upper pad portion 26 may taper upwardly along a direction from the bottom surface 262 towards the top surface 261. In some embodiments, the top surface 261 and the side surface 263 of the upper pad portion 26 may constitute a continuous curved surface. Further, an included angle θa between the bottom surface 262 and the side surface 263 may be an acute angle.

Figure 17:
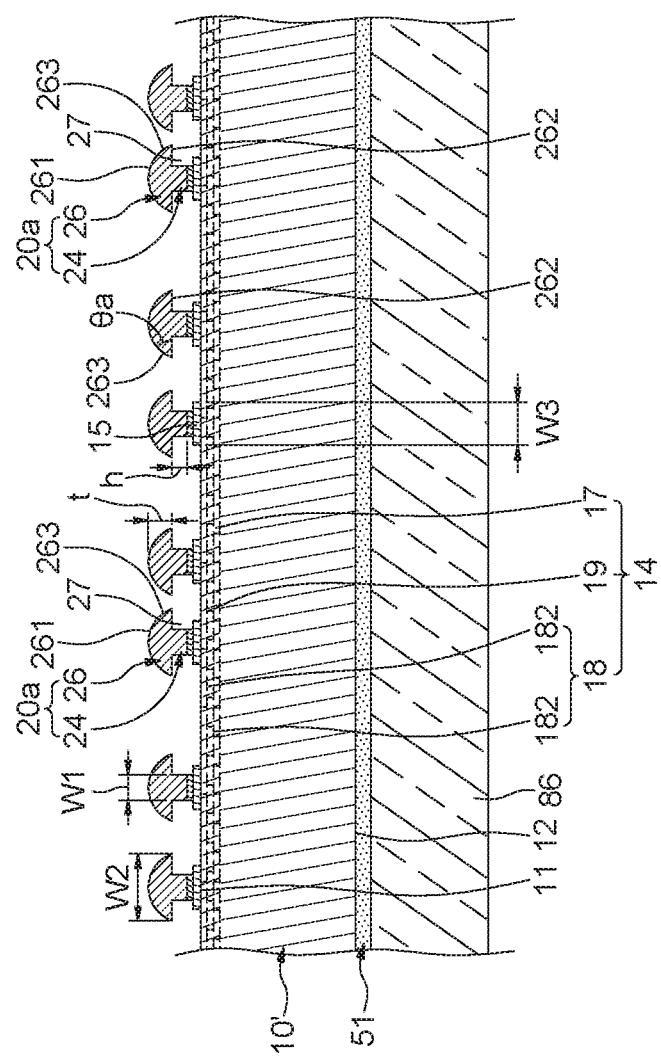
FIG. 17 illustrates one or more stages of an example of a method for manufacturing a semiconductor package structure according to some embodiments of the present disclosure.

Referring to FIG. 17, the photoresist layer 90 is removed to expose the mushroom-shaped pillar structures 20a (including, for example, the upper pad portions 26, the recess portions 27 and the lower pillar portion 24). Then, portions of the seed layer 16 that are not covered by the lower pillar portions 24 of the pillar structures 20a are removed to expose a portion of each of the conductive pads 15.

Figure 18:
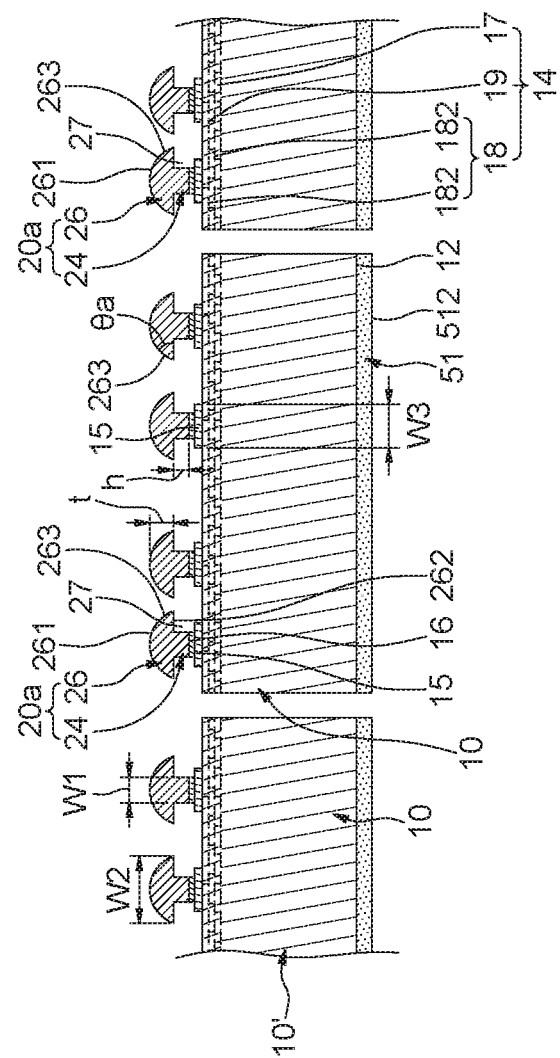
FIG. 18 illustrates one or more stages of an example of a method for manufacturing a semiconductor package structure according to some embodiments of the present disclosure.

Referring to FIG. 18, the semiconductor substrate 10' is singulated to form a plurality of semiconductor dice 10. In some embodiments, at least one mushroom-shaped pillar structures 20a is located on each of the semiconductor dice 10.

Figure 19:
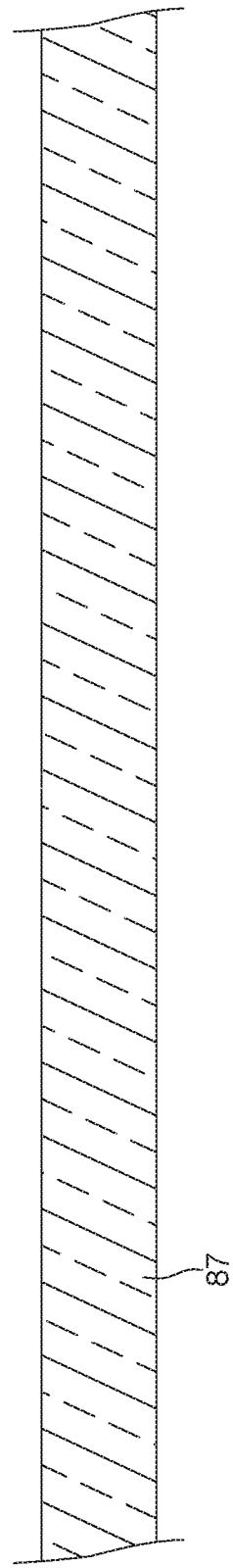
FIG. 19 illustrates one or more stages of an example of a method for manufacturing a semiconductor package structure according to some embodiments of the present disclosure.

FIG. 19 depicts a stage subsequent to that depicted in FIG. 14 or FIG. 18. As shown in FIG. 19, a carrier 87 is provided.

Figure 20:
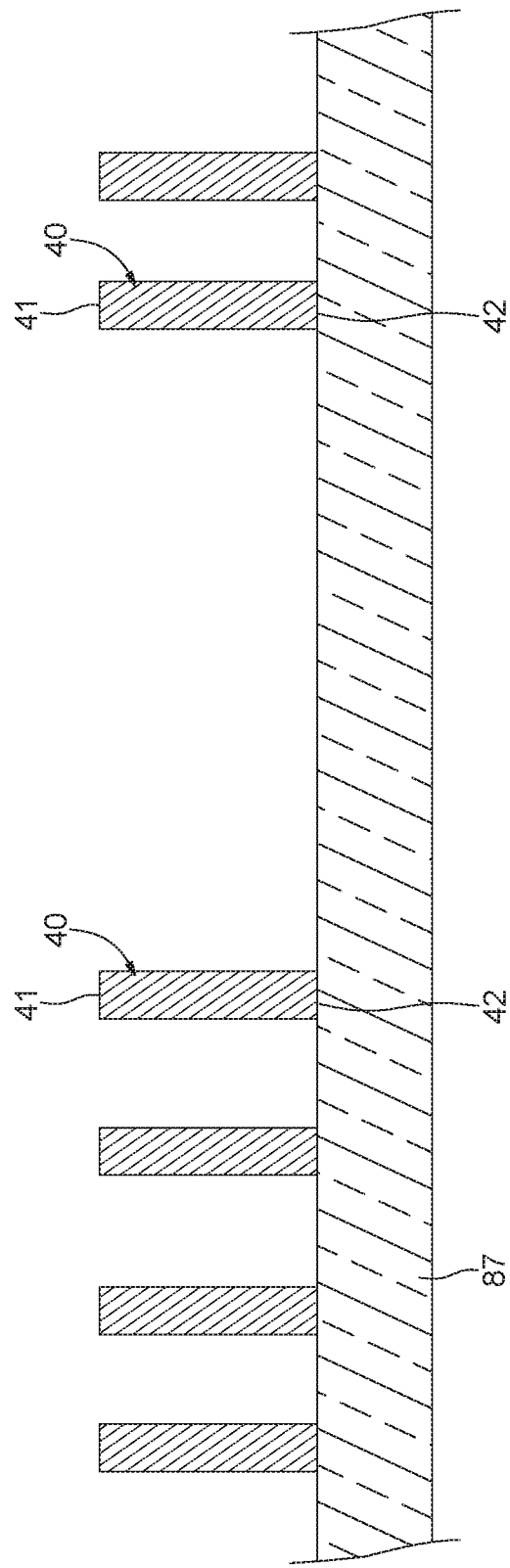
FIG. 20 illustrates one or more stages of an example of a method for manufacturing a semiconductor package structure according to some embodiments of the present disclosure.

Referring to FIG. 20, a plurality of conductive pillars 40 are formed on the carrier 87 by, for example, plating. A material of each of the conductive pillars 40 may be, for example, copper. Each of the conductive pillars 40 has a top surface 41 and a bottom surface 42 opposite to the top surface 41.

Figure 21:
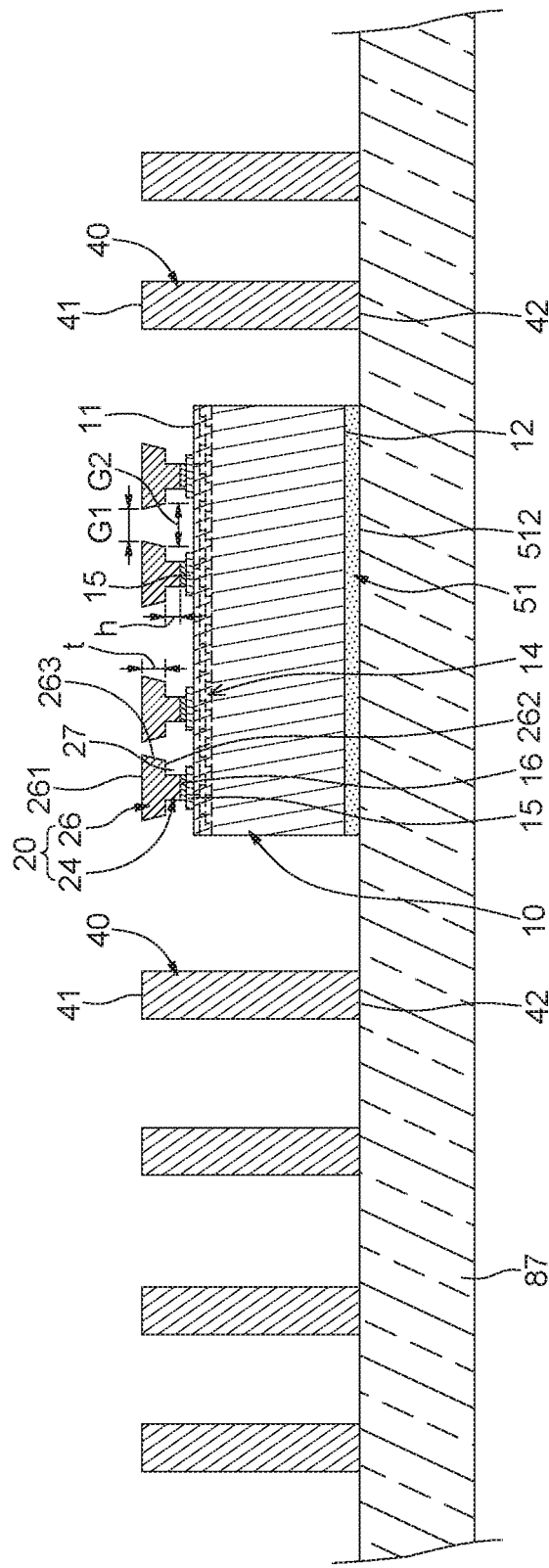
FIG. 21 illustrates one or more stages of an example of a method for manufacturing a semiconductor package structure according to some embodiments of the present disclosure.

Referring to FIG. 21, at least one semiconductor die 10 (e.g., at least a singulated portion of the semiconductor substrate 10' of FIG. 14) is attached to the carrier 87 through the adhesive layer 51. The semiconductor die 10 may be disposed adjacent to the conductive pillars 40.

Figure 22:
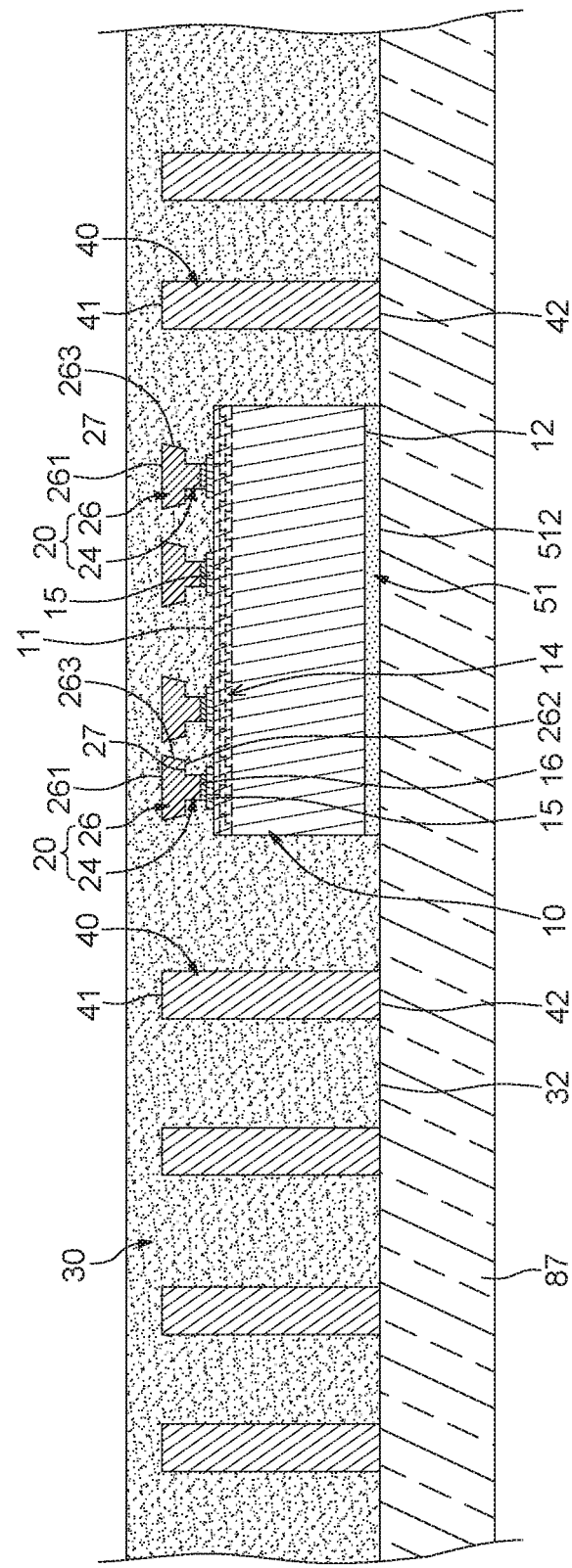
FIG. 22 illustrates one or more stages of an example of a method for manufacturing a semiconductor package structure according to some embodiments of the present disclosure.

Referring to FIG. 22, an encapsulant 30 is formed to cover the carrier 87, the semiconductor die 10 (e.g., the singulated portion of the semiconductor substrate 10' of FIG. 14), the pillar structure 20 on the semiconductor die 10 and the conductive pillars 40. A material of the encapsulant 30 may be a molding compound with or without fillers. The encapsulant 30 has a lower surface 32. The lower surface 32 of the encapsulant 30 may be substantially coplanar with the bottom surface 42 of each of the conductive pillars 40 and a bottom surface 512 of the adhesive layer 51.

Figure 23:
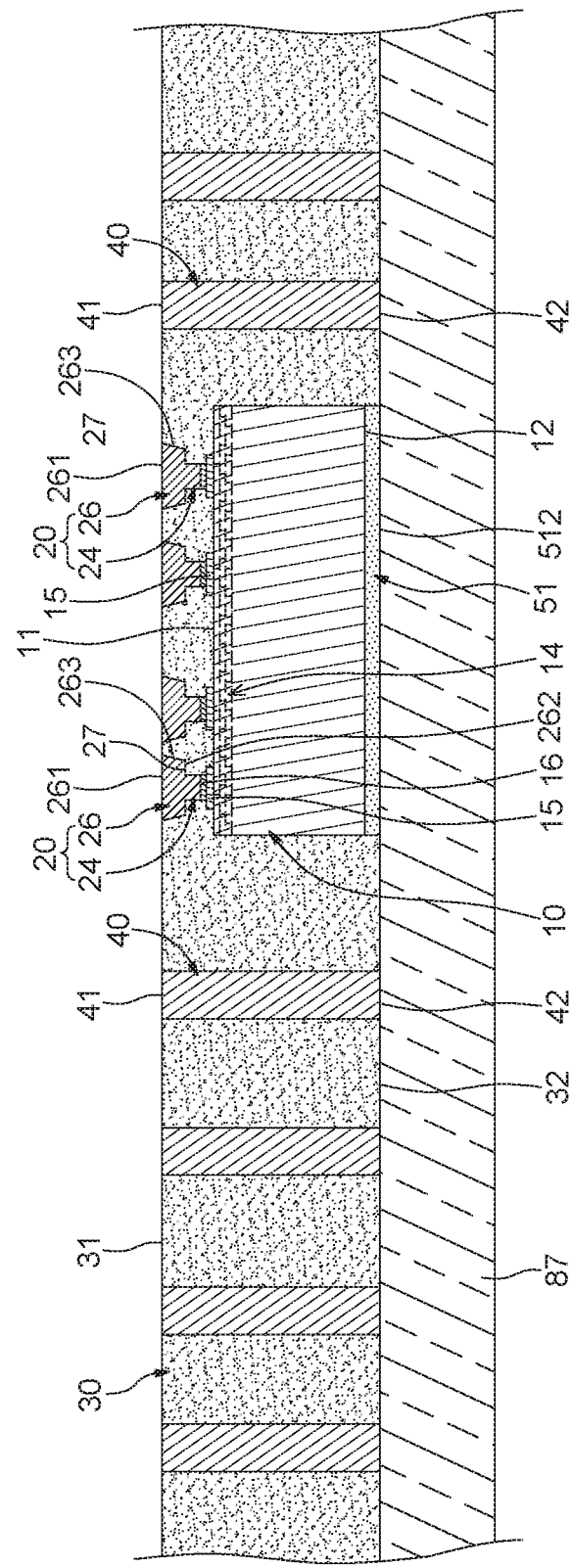
FIG. 23 illustrates one or more stages of an example of a method for manufacturing a semiconductor package structure according to some embodiments of the present disclosure.

Referring to FIG. 23, a portion of the encapsulant 30 is removed through, for example, grinding. Further, the top surface 261 of the upper pad portion 26 of the pillar structure 20 and the top surface 41 of each of the conductive pillars 40 may be exposed from an upper surface 31 of the encapsulant 30. In some embodiments, a portion of the upper pad portion 26 of the pillar structure 20 may be removed to expose the top surface 261, and a portion of each of the conductive pillars 40 may be removed to expose the top surface 41. The upper surface 31 of the encapsulant 30 may be substantially coplanar with the top surface 261 of the upper pad portion 26 of the pillar structure 20 and the top surface 41 of each of the conductive pillars 40.

Then, the carrier 87 may be removed, a protection layer 83 may be formed on the lower surface 32 of the encapsulant 30 and may define a plurality of openings 832 extending through the protection layer 83, a plurality of electrical connectors 85 may be formed or disposed in the openings 832 of the protection layer 83, and a singulation process may be conducted to obtain a plurality of semiconductor package structures 1 of FIG. 1.

Figure 24:
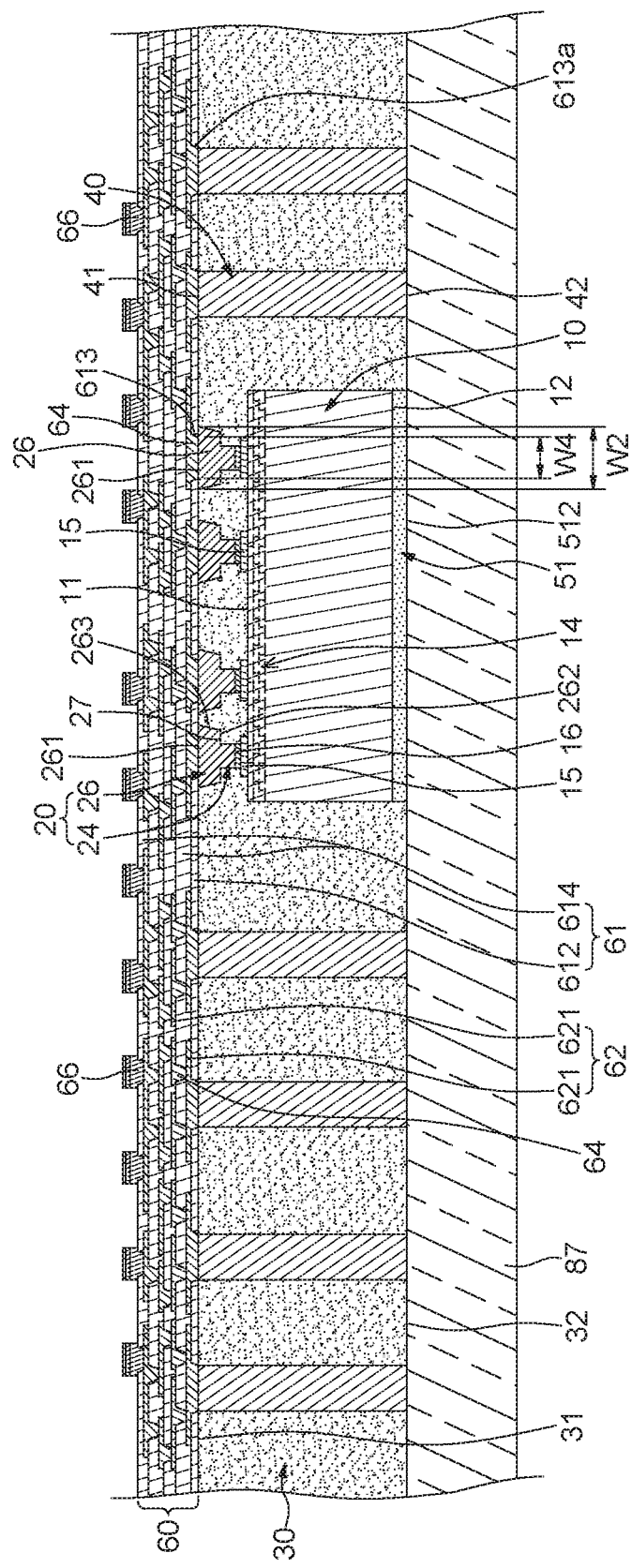
FIG. 24 illustrates one or more stages of an example of a method for manufacturing a semiconductor package structure according to some embodiments of the present disclosure.

FIG. 24 through FIG. 30 illustrate a method for manufacturing a semiconductor package structure according to some embodiments of the present disclosure. In some embodiments, the method is for manufacturing a semiconductor package structure such as the semiconductor package structure 1a shown in FIG. 4. The initial several stages of the illustrated process are the same as, or similar to, the stages illustrated in FIG. 5 through FIG. 23. FIG. 24 depicts a stage subsequent to that depicted in FIG. 23.

Referring to FIG. 24, a redistribution structure 60 is formed on the upper surface 31 of the encapsulant 30 and electrically connected to the upper pad portion 26 of the pillar structure 20 and the conductive pillars 40. In some embodiments, the upper pad portion 26 of the pillar structure 20 and the conductive pillars 40 may contact the redistribution structure 60 directly.

The redistribution structure 60 may include a dielectric structure 61, a redistribution layer 62, a plurality of inner vias 64 and a plurality of bonding pads 66. The dielectric structure 61 may include a first dielectric layer 612 and at least one second dielectric layer 614. The first dielectric layer 612 may be disposed on the upper surface 31 of the encapsulant 30, and may define at least one first opening 613 extending through the first dielectric layer 612 to expose a portion (e.g., a portion of the top surface 261) of the upper pad portion 26 of the pillar structure 20 and a plurality of second openings 613a extending through the first dielectric layer 612 to expose a portion (e.g., at least a portion of the top surface 41) of each of the conductive pillars 40. In some embodiments, a width W4 of the first opening 613 may be less than the maximum width W2 of the upper pad portion 26. Thus, the upper pad portion 26 may provide more alignment tolerance to ensure the first opening 613 of the first dielectric layer 612 being aligned with the upper pad portion 26 of the pillar structure 20. The second dielectric layer 614 may be disposed on a top surface of the first dielectric layer 612. The first dielectric layer 612 and the second dielectric layer 614 may be made of a cured photo-imageable dielectric (PID) material such as epoxy or polyimide (PI) including photoinitiators. The redistribution layer 62 may be embedded in the dielectric structure 61 and may include a plurality of circuit layers 621. The inner vias 64 may electrically connect at least one circuit layer 621 or two adjacent circuit layers 621 of the redistribution layer 62. In some embodiments, some of the inner vias 64 may be formed on or contact the exposed portion (e.g., the exposed portion of the top surface 261) of the upper pad portion 26 of the pillar structure 20 and the exposed portion (e.g., the exposed portion of the top surface 41) of the conductive pillars 40 directly. Further, the inner vias 64 may taper toward the encapsulant 30. As shown in FIG. 24, the topmost second dielectric layer 614 may cover the topmost circuit layer 621, and may define a plurality of openings to expose portions of the topmost circuit layer 621. The bonding pads 66 may be disposed in the openings of the topmost second dielectric layer 614 and on the expose portions of the topmost circuit layer 621.

Figure 25:
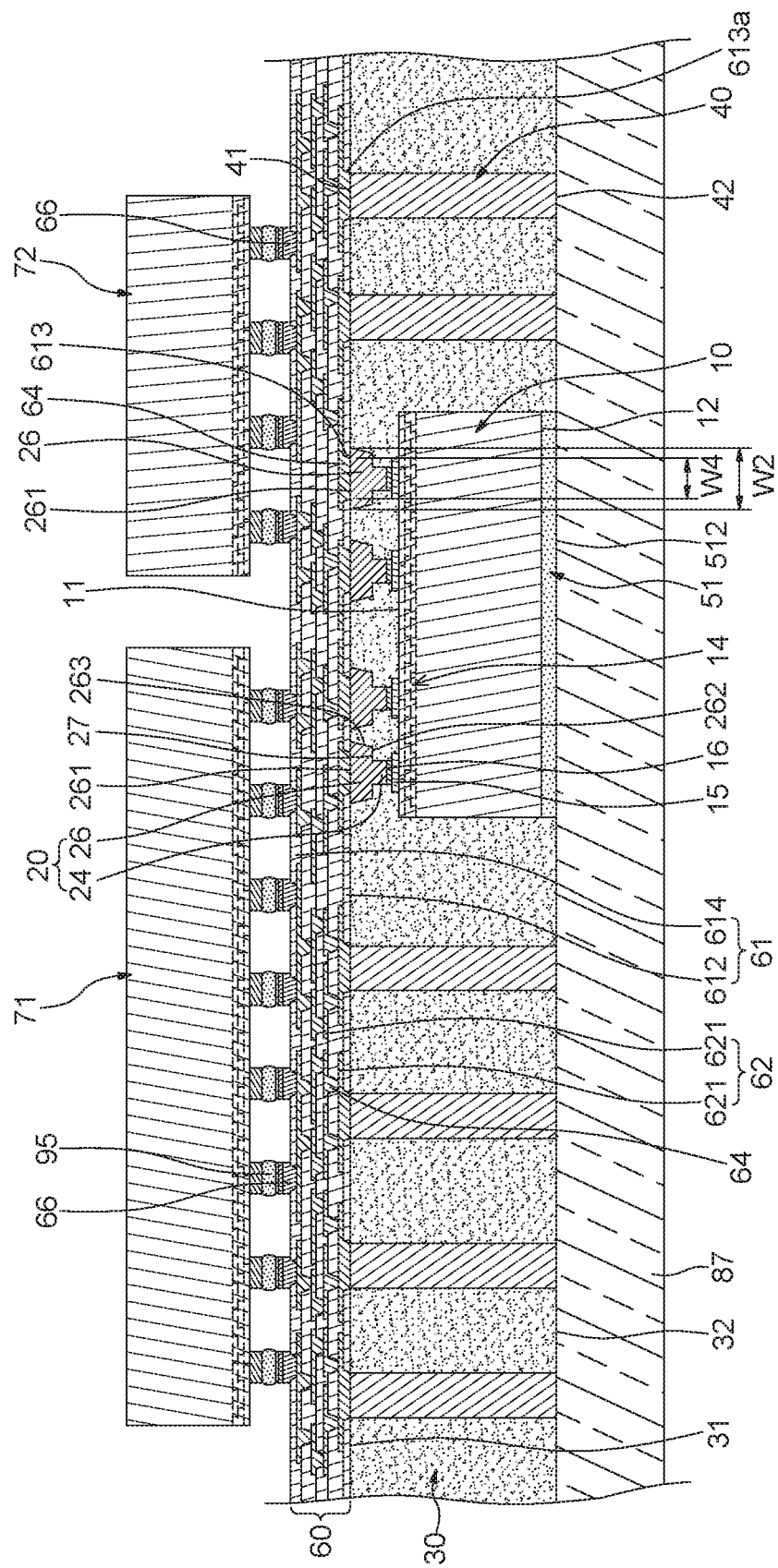
FIG. 25 illustrates one or more stages of an example of a method for manufacturing a semiconductor package structure according to some embodiments of the present disclosure.

Referring to FIG. 25, a first semiconductor device 71 and a second semiconductor device 72 are disposed adjacent to the redistribution structure 60 and electrically connected to the redistribution structure 60. The first semiconductor device 71 may be, for example, an application specific integrated circuit (ASIC) device. The second semiconductor device 72 may be, for example, a high bandwidth memory (HBM) device. In some embodiments, the first semiconductor device 71 and the second semiconductor device 72 may be bonded to the bonding pads 66 of the redistribution structure 60 through a bonding material 95.

Figure 26:
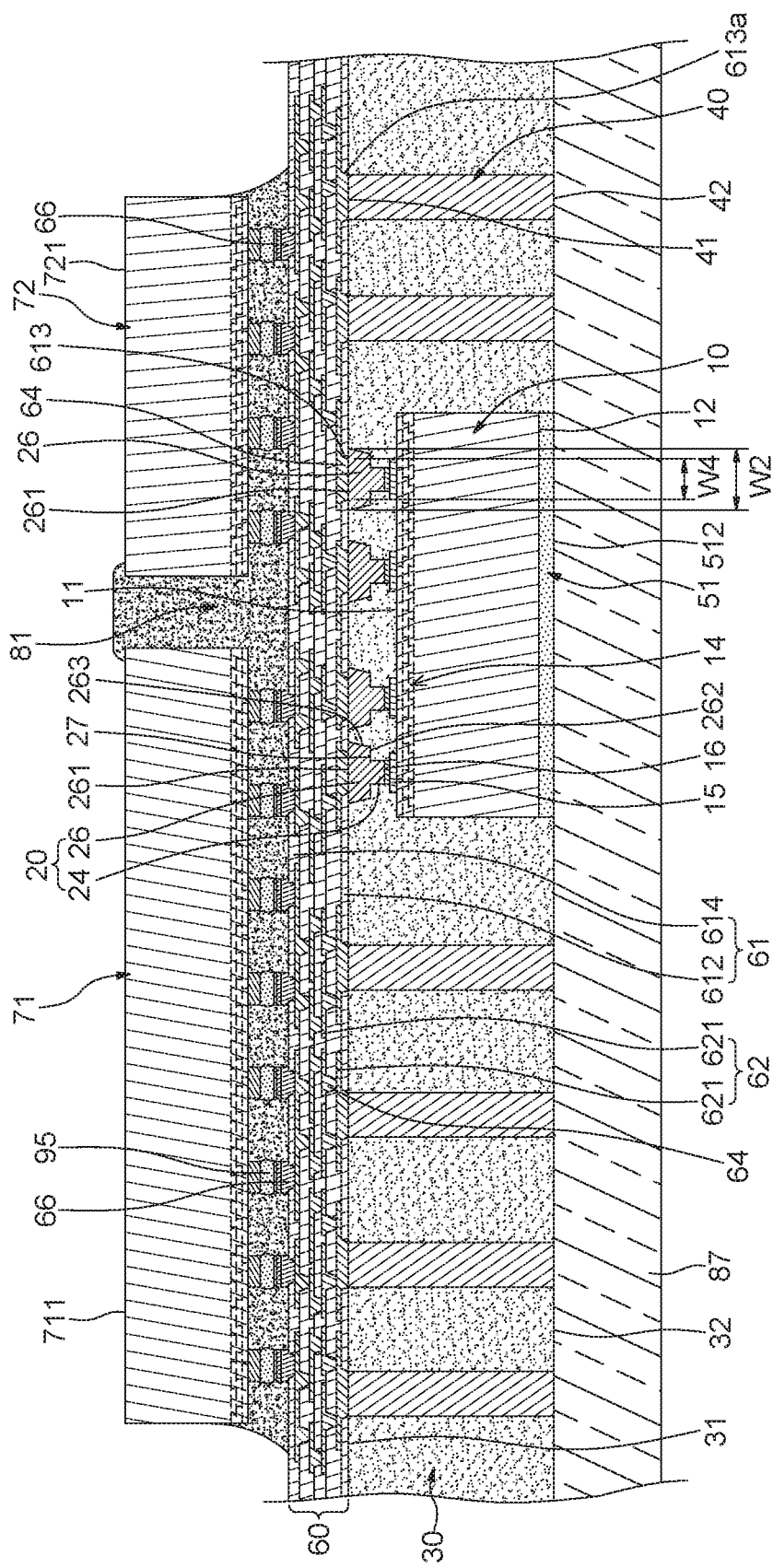
FIG. 26 illustrates one or more stages of an example of a method for manufacturing a semiconductor package structure according to some embodiments of the present disclosure.

Referring to FIG. 26, an underfill 81 is formed between the first semiconductor device 71 and the redistribution structure 60 and between the second semiconductor device 72 and the redistribution structure 60 to cover the bonding pads 66 of the redistribution structure 60 and the bonding material 95. In some embodiments, a portion of the underfill 81 may extend between the first semiconductor device 71 and the second semiconductor device 72. Further, the extending portion may cover a portion of a top surface 711 of the first semiconductor device 71 and a portion of a top surface 721 of the second semiconductor device 72.

Figure 27:
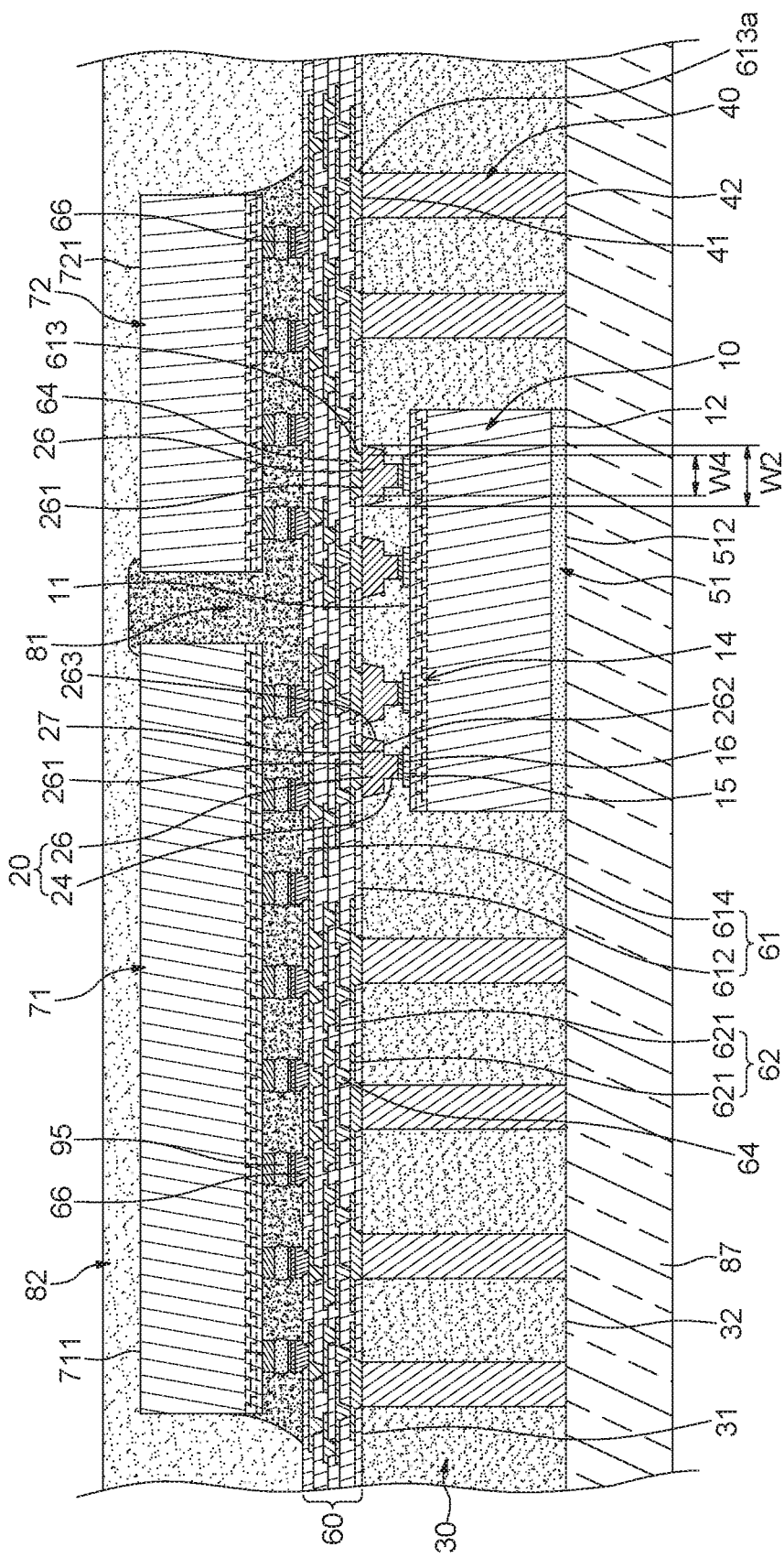
FIG. 27 illustrates one or more stages of an example of a method for manufacturing a semiconductor package structure according to some embodiments of the present disclosure.

Referring to FIG. 27, an encapsulant 82 is formed to cover the redistribution structure 60, the first semiconductor device 71, the second semiconductor device 72 and the underfill 81. A material of the encapsulant 82 may be a molding compound with or without fillers.

Figure 28:
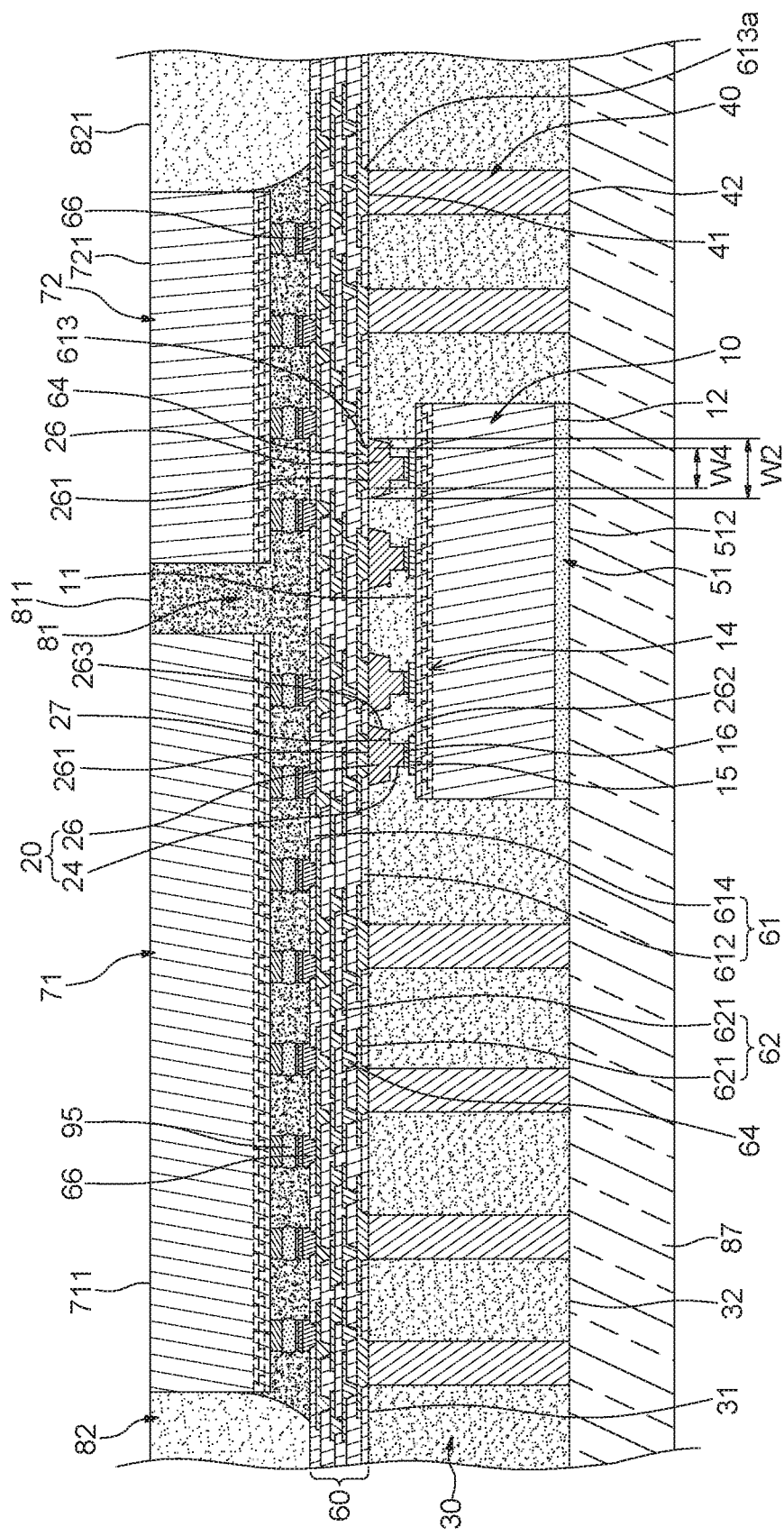
FIG. 28 illustrates one or more stages of an example of a method for manufacturing a semiconductor package structure according to some embodiments of the present disclosure.

Referring to FIG. 28, a portion of the encapsulant 82 and a portion of the extending portion of the underfill 81 are removed through, for example, grinding. Further, the top surface 711 of the first semiconductor device 71, the top surface 721 of the second semiconductor device 72 and a top surface 811 of the extending portion of the underfill 81 may be exposed from an upper surface 821 of the encapsulant 82. In some embodiments, the upper surface 821 of the encapsulant 82 may be substantially coplanar with the top surface 711 of the first semiconductor device 71, the top surface 721 of the second semiconductor device 72 and the top surface 811 of the extending portion of the underfill 81.

Figure 29:
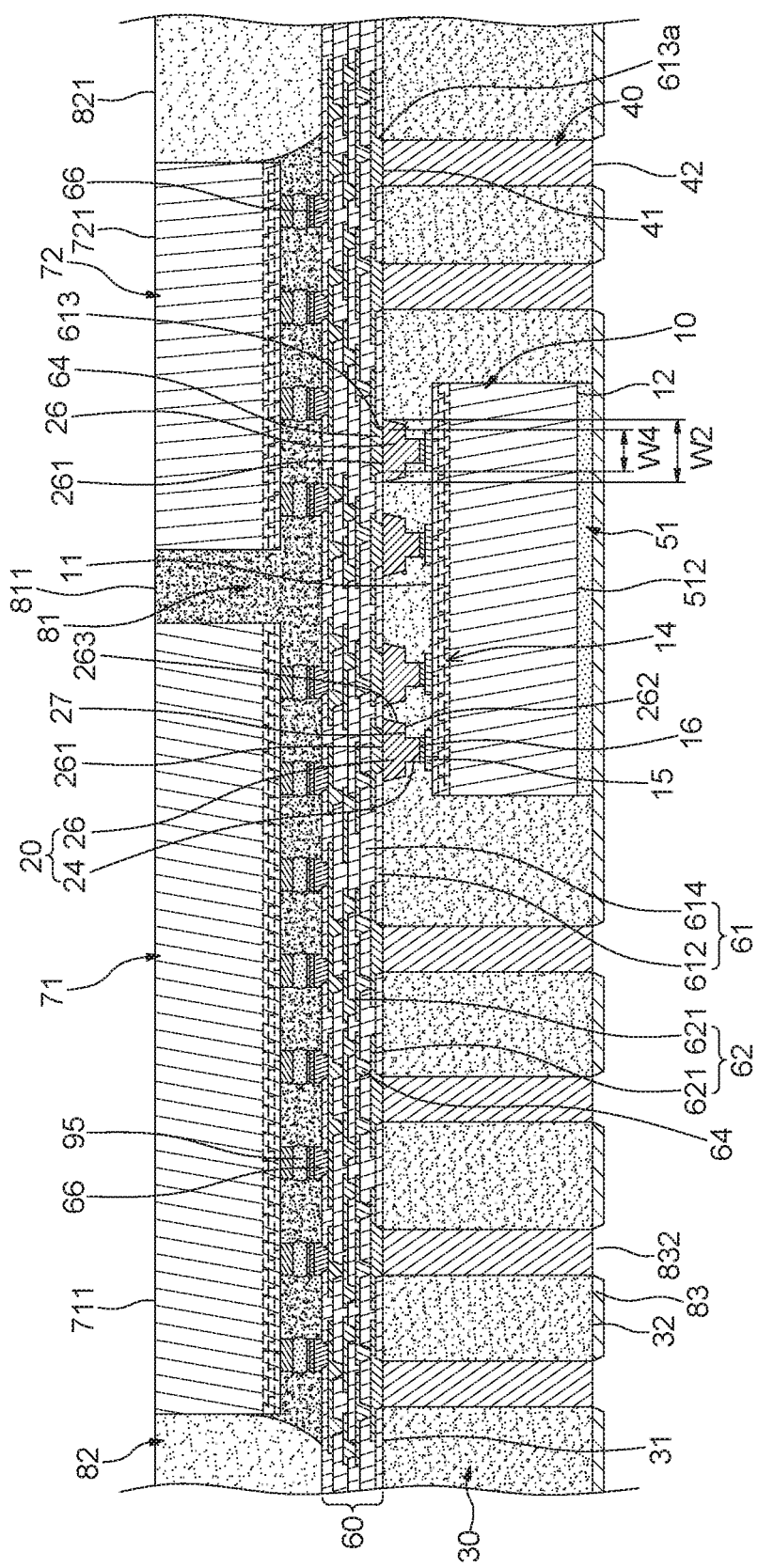
FIG. 29 illustrates one or more stages of an example of a method for manufacturing a semiconductor package structure according to some embodiments of the present disclosure.

Referring to FIG. 29, the carrier 87 is removed, and then a protection layer 83 is formed on the lower surface 32 of the encapsulant 30 and may define a plurality of openings 832 extending through the protection layer 83. Each of the openings 832 may expose at least a portion of the bottom surface 42 of each of the conductive pillars 40. In some embodiments, the protection layer 83 may cover the adhesive layer 51.

Figure 30:
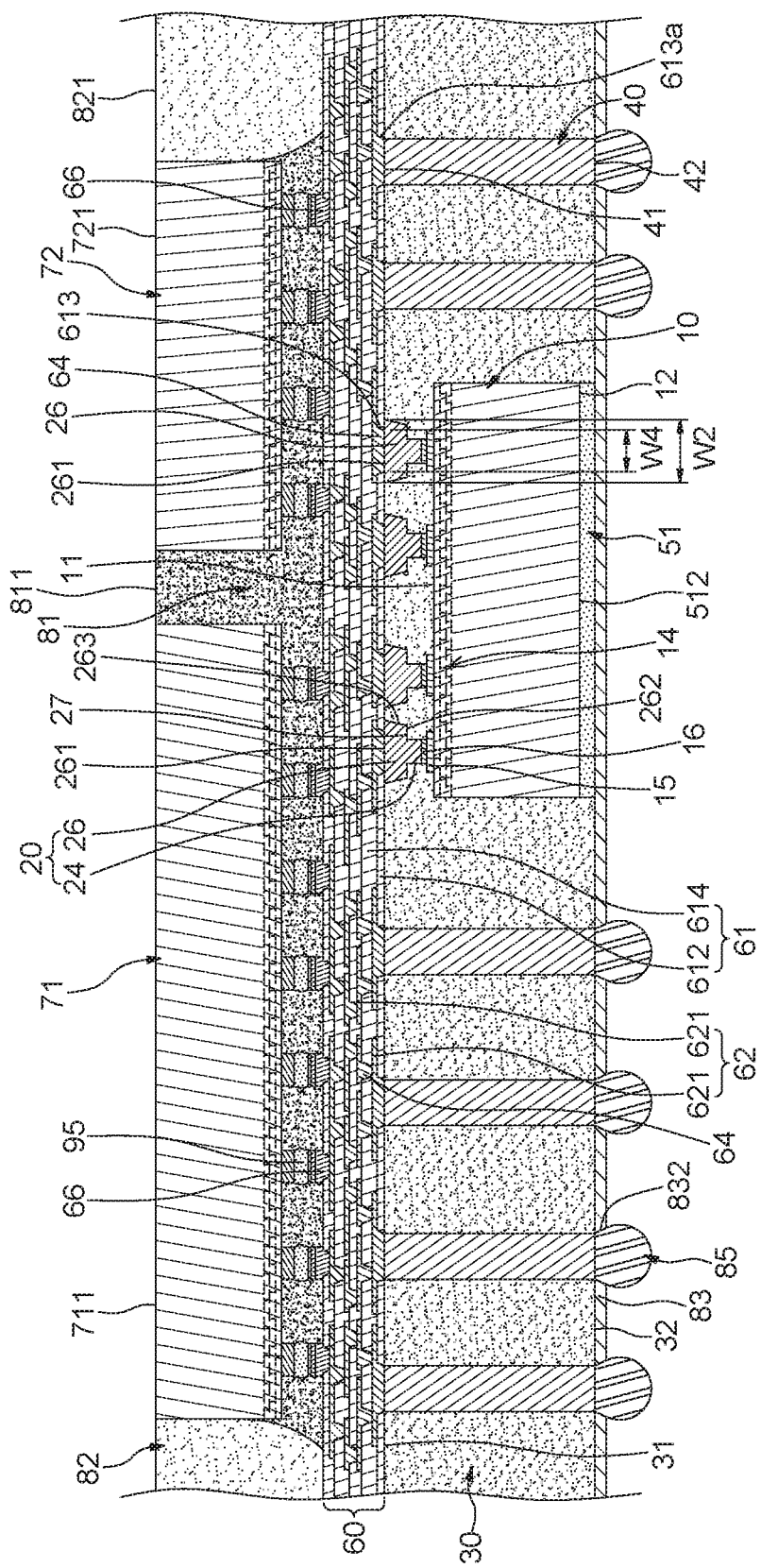
FIG. 30 illustrates one or more stages of an example of a method for manufacturing a semiconductor package structure according to some embodiments of the present disclosure.

Referring to FIG. 30, a plurality of electrical connectors 85 are formed or disposed in the openings 832 of the protection layer 83 and on the exposed portions of the bottom surfaces 42 of the conductive pillars 40 for external connection.

Then, a singulation process is conducted to obtain a plurality of semiconductor package structures 1a of FIG. 4.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be deemed to be "substantially" the same or equal to a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 μm, no greater than 2 μm, no greater than 1 μm, or no greater than 0.5 μm. A surface can be deemed to be substantially flat if a displacement between a highest point and a lowest point of the surface is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor package structure, comprising:
   a semiconductor die having an active surface;
   a plurality of pillars disposed on and protruding from the active surface, wherein each of the plurality of pillars includes a lower portion disposed on the active surface and an upper portion located on the lower portion, wherein a first width of the upper portion is greater than a second width of the lower portion, wherein a space is between two adjacent upper portions, and a width of the space gradually increases toward the semiconductor die in a cross-sectional view; and
   a monolithic encapsulant encapsulating the semiconductor die, extending onto the active surface of the semiconductor die, and contacting a sidewall of the upper portion and a sidewall of the lower portion.

2. The semiconductor package structure of claim 1, wherein the upper portion includes a bottom surface connecting a lateral surface of the lower portion, and the monolithic encapsulant contacts the bottom surface of the upper portion.

3. The semiconductor package structure of claim 2, wherein the semiconductor die includes a pad located on the active surface, one of the plurality of pillars is disposed over the pad, and a horizontal distance from the lateral surface of the lower portion to a lateral surface of the upper portions is greater than a horizontal distance from the lateral surface of the lower portion to a lateral surface of the pad.

4. The semiconductor package structure of claim 1, wherein the semiconductor die includes a pad located on and protruding from the active surface, one of the plurality of pillars is disposed on the pad and exposes a portion of an upper surface of the pad, and the monolithic encapsulant contacts the portion of the upper surface of the pad.

5. The semiconductor package structure of claim 1, wherein the semiconductor die includes a bridge die.

6. The semiconductor package structure of claim 5, further comprising at least two electronic components disposed over the bridge die and overlapping with the bridge die.

7. The semiconductor package structure of claim 1, further comprising a conductive pillar disposed at a side of the semiconductor die, wherein the monolithic encapsulant encapsulates the conductive pillar, and a width of an upper surface of the upper portion is greater than a width of the conductive pillar.

8. The semiconductor package structure of claim 7, wherein the conductive pillar has an upper surface substantially aligned with the upper surface of the upper portion and a lower surface opposite to the upper surface, and the semiconductor package structure further includes an electrical connector contacting the lower surface of the conductive pillar and configured to electrically connect an external circuit.

9. The semiconductor package structure of claim 1, further comprising a conductive pillar disposed at a side of the semiconductor die, wherein the monolithic encapsulant encapsulates the conductive pillar, a width of an upper surface of the upper portion is greater than a width of the conductive pillar, the upper portion includes a bottom surface connecting a lateral surface of the lower portion, the monolithic encapsulant contacts the bottom surface of the upper portion, the semiconductor die includes a pad located on and protruding from the active surface, one of the plurality of pillars is located on the pad and exposes a portion of an upper surface of the pad, the monolithic encapsulant contacts the portion of the upper surface of the pad, and the semiconductor die includes a bridge die.

10. A semiconductor package structure, comprising:
    a semiconductor die having an active surface and including at least one pad located on the active surface; and
    at least one pillar disposed over the pad, the pillar defining a recess portion connected to the pad and a wide portion located on the recess portion;
    wherein a width of an upper surface of the wide portion is greater than a width of an upper surface of the pad;
    wherein in a cross-sectional view, a lateral surface of the wide portion includes a curved surface, and a width of the wide portion gradually increases toward the recess portion.

11. The semiconductor package structure of claim 10, wherein a seed layer is disposed between the recess portion and the pad of the semiconductor die, and a lateral surface of the recess portion is substantially aligned with a lateral surface of the seed layer.

12. The semiconductor package structure of claim 10, wherein an area of the upper surface of the wide portion is greater than an area of the upper surface of the pad.

13. The semiconductor package structure of claim 12, further comprising a circuit pattern layer disposed on the wide portion, wherein the circuit pattern layer includes a dielectric layer, the dielectric layer includes an opening exposing the upper surface of the wide portion, and a width of the opening is greater than the width of the upper surface of the pad and less than the width of the upper surface of the wide portion.

14. The semiconductor package structure of claim 10, wherein the at least one pad includes a plurality of pads, the at least one pillar includes a plurality of pillars, and a distance between two adjacent wide portions is less than a distance between two adjacent pads.

15. A semiconductor package structure, comprising:
    a semiconductor die having an active surface and including at least one pad located on the active surface;
    at least one pillar disposed over the pad, the pillar defining a recess portion connected to the pad and a wide portion located on the recess portion; and
    a seed layer disposed between the recess portion and the pad of the semiconductor die, wherein the seed layer contacts the recess portion and the pad, and the seed layer is spaced apart from the wide portion;

wherein a width of an upper surface of the wide portion is greater than a width of an upper surface of the pad, and an area of the upper surface of the wide portion is greater than an area of the upper surface of the pad.

16. The semiconductor package structure of claim 15, wherein a width of the wide portion is greater than a width of the seed layer.

17. A semiconductor package structure, comprising:
a semiconductor die having an active surface and including at least one pad located on the active surface;
at least one pillar disposed over the pad, the pillar defining a recess portion connected to the pad and a wide portion located on the recess portion; and
at least two electronic components disposed above the active surface of the semiconductor die and in communication with each other through the semiconductor die;
wherein a width of an upper surface of the wide portion is greater than a width of an upper surface of the pad.

18. A semiconductor package structure, comprising:
a semiconductor die having an active surface and including at least one pad located on the active surface;
at least one pillar disposed over the pad, the pillar defining a recess portion connected to the pad and a wide portion located on the recess portion; and
at least two electronic components disposed above the active surface of the semiconductor die and in communication with each other through the semiconductor die, wherein in a cross-sectional view, a lateral surface of the wide portion includes a curved surface, an area of the upper surface of the wide portion is greater than an area of the upper surface of the pad, the at least one pad includes a plurality of pads, the at least one pillar includes a plurality of pillars, a distance between two adjacent wide portions is less than a distance between two adjacent pads, and a width of an upper surface of the wide portion is greater than a width of an upper surface of the pad.

\* \* \* \* \*